(12) United States Patent
Xiao et al.

(10) Patent No.: US 11,800,771 B2
(45) Date of Patent: Oct. 24, 2023

(54) DISPLAY SUBSTRATE, FINE METAL MASK SET AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Leifang Xiao, Beijing (CN); Fengli Ji, Beijing (CN); Sen Du, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/448,200

(22) Filed: Sep. 20, 2021

(65) Prior Publication Data

US 2022/0005885 A1     Jan. 6, 2022

Related U.S. Application Data

(63) Continuation of application No. 16/462,214, filed as application No. PCT/CN2018/114564 on Nov. 8, 2018, now Pat. No. 11,145,693.

(30) Foreign Application Priority Data

Jan. 2, 2018     (CN) .......................... 201810002775.0

(51) Int. Cl.
*H01L 27/32*     (2006.01)
*H10K 59/35*     (2023.01)
(Continued)

(52) U.S. Cl.
CPC ......... *H10K 59/353* (2023.02); *C23C 14/042* (2013.01); *C23C 14/12* (2013.01);
(Continued)

(58) Field of Classification Search
CPC ............ H01L 27/3218; H01L 27/3216; G09G 2300/0452
See application file for complete search history.

(56) References Cited

U.S. PATENT DOCUMENTS 9,240,436 B2     1/2016     Shen et al.
9,935,155 B2     4/2018     Huangfu et al.
(Continued)

FOREIGN PATENT DOCUMENTS

CN     103985735 A     8/2014
CN     104269411 A     1/2015
(Continued)

OTHER PUBLICATIONS

First Chinese Office Action dated Oct. 25, 2019, received for corresponding Chinese Application No. 201810002775.0.
(Continued)

*Primary Examiner* — Feifei Yeung Lopez
(74) *Attorney, Agent, or Firm* — Kinney & Lange, P.A.

(57)     ABSTRACT

A display substrate includes a plurality of first pixels and a plurality of second pixels alternately arranged in a first direction and a second direction. Each of the first pixels includes a first sub-pixel and a second sub-pixel, and each of the second pixels includes a third sub-pixel and a second sub-pixel. The second sub-pixels are evenly arranged in a matrix. The first sub-pixel and the third sub-pixel are both in a polygonal shape, and are alternately arranged in the first direction and the second direction. For one first sub-pixel and one third sub-pixel adjacent to each other in the first direction, a line connecting a vertex of the one first sub-pixel
(Continued)

closest to the one third sub-pixel with a vertex of the one third sub-pixel closest to the one first sub-pixel intersects an extension line in the first direction and an extension line in the second direction.

19 Claims, 15 Drawing Sheets

(51) Int. Cl.
    *C23C 14/04* (2006.01)
    *C23C 14/12* (2006.01)
    *C23C 14/24* (2006.01)
    *H10K 71/00* (2023.01)
    *H10K 71/16* (2023.01)

(52) U.S. Cl.
    CPC ........... *C23C 14/24* (2013.01); *H10K 59/352* (2023.02); *H10K 71/00* (2023.02); *H10K 71/166* (2023.02); *G09G 2300/0452* (2013.01)

(56) References Cited

U.S. PATENT DOCUMENTS

| | | | |
|---|---|---|---|
| 2002/0021394 A1 | 2/2002 | Kressmann et al. | |
| 2002/0070909 A1 | 6/2002 | Asano et al. | |
| 2008/0001525 A1* | 1/2008 | Chao | H01L 27/3218 313/503 |
| 2011/0012820 A1* | 1/2011 | Kim | G09G 3/3208 345/82 |
| 2011/0291549 A1* | 12/2011 | Kim | H01L 27/3218 313/504 |
| 2014/0197385 A1* | 7/2014 | Madigan | H01L 51/56 438/34 |
| 2014/0319479 A1 | 10/2014 | Park et al. | |
| 2015/0311264 A1 | 10/2015 | Shen et al. | |
| 2016/0078807 A1 | 3/2016 | Sun et al. | |
| 2017/0104040 A1 | 4/2017 | Huangfu et al. | |
| 2018/0247984 A1 | 8/2018 | Wang | |

FOREIGN PATENT DOCUMENTS

| | | | |
|---|---|---|---|
| CN | 104766563 A | 7/2015 | |
| CN | 106571428 A | 4/2017 | |
| CN | 106959558 A | 7/2017 | |
| CN | 207966988 U | 10/2018 | |

OTHER PUBLICATIONS

Internaitonal Search Report and English Translation of Box V of the Written Opinion dated Jan. 30, 2019, received for corresponding PCT Application No. PCT/CN2018/114564.

Second Chinese Office Action dated May 19, 2020, received for corresponding Chinese Application No. 201810002775.0.

* cited by examiner

DISPLAY SUBSTRATE, FINE METAL MASK SET AND DISPLAY DEVICE

CROSS-REFERENCE TO RELATED APPLICATIONS

This application is a continuation application of U.S. application Ser. No. 16/462,214, filed on May 17, 2019, which in turn is a Section 371 National Stage Application of International Application No. PCT/CN2018/114564, filed on Nov. 8, 2018, which in turn claims the benefit of Chinese Patent Application No. 20180002775.0 filed on Jan. 2, 2018 in the State Intellectual Property Office of China, the whole disclosures of which are incorporated herein by reference.

TECHNICAL FIELD

The present disclosure relates to the field of display technology, and in particular, to a display substrate, a fine metal mask set and a display device.

BACKGROUND

Organic light emitting diode (OLED) displays are one of the hotspots in the field of flat panel displays. Compared with liquid crystal displays, OLED display has the advantages of low energy consumption, low production cost, self-illumination, wide viewing angle, fast response and so on. At present, in the field of flat panel displays such as mobile phones, PDAs, and digital cameras, OLED displays have begun to replace the traditional liquid crystal displays (LCDs).

SUMMARY

Some embodiments of the present disclosure provide a display substrate comprising: a plurality of first pixels and a plurality of second pixels alternately arranged in both a first direction and a second direction, wherein each of the first pixels comprises a first sub-pixel and a second sub-pixel, and each of the second pixels comprises a third sub-pixel and a second sub-pixel, wherein the second sub-pixels are evenly arranged in a matrix, wherein the first sub-pixel and the third sub-pixel are both in a polygonal shape, and are alternately arranged in both the first direction and the second direction; in a group consisting of one first sub-pixel and one third sub-pixel adjacent to each other in the first direction, a line connecting a vertex of the one first sub-pixel closest to the one third sub-pixel with a vertex of the one third sub-pixel closest to the one first sub-pixel intersects an extension line in the first direction and an extension line in the second direction.

In some embodiments, in a group consisting of one first sub-pixel and one third sub-pixel adjacent to each other in the second direction, a line connecting a vertex of the one first sub-pixel closest to the one third sub-pixel with a vertex of the one third sub-pixel closest to the one first sub-pixel intersects the extension line in the first direction and the extension line in the second direction; or in a group consisting of one first sub-pixel and one third sub-pixel adjacent to each other in the second direction, a line connecting a vertex of the one first sub-pixel closest to the one third sub-pixel with a vertex of the one third sub-pixel closest to the one first sub-pixel is parallel to the extension line in the second direction.

In some embodiments, each of the second sub-pixels is in a shape of polygon, and in a group consisting of two adjacent second sub-pixels in the second direction, a line connecting a vertex of one of the two adjacent second sub-pixels closest to the other of the two adjacent second sub-pixels with a vertex of the other of the two adjacent second sub-pixels closest to the one of the two adjacent second sub-pixels intersects the extension line in the first direction and the extension line in the second direction.

In some embodiments, in a group consisting of two adjacent second sub-pixels in the first direction, a line connecting a vertex of one of the two adjacent second sub-pixels closest to the other of the two adjacent second sub-pixels with a vertex of the other of the two adjacent second sub-pixels closest to the one of the two adjacent second sub-pixels intersects the extension line in the first direction and the extension line in the second direction; or in a group consisting of two adjacent second sub-pixels in the first direction, a line connecting a vertex of one of the two adjacent second sub-pixels closest to the other of the two adjacent second sub-pixels with a vertex of the other of the two adjacent second sub-pixels closest to the one of the two adjacent second sub-pixels is parallel to the extension line in the first direction.

In some embodiments, in a group consisting of two adjacent first sub-pixels in the first direction, a line connecting a vertex of one of the two adjacent first sub-pixels closest to the other of the two adjacent first sub-pixels with a vertex of the other of the two adjacent first sub-pixels closest to the one of the two adjacent first sub-pixels intersects the extension line in the first direction and the extension line in the second direction; in a group consisting of two adjacent first sub-pixels in the second direction, a line connecting a vertex of one of the two adjacent first sub-pixels closest to the other of the two adjacent first sub-pixels with a vertex of the other of the two adjacent first sub-pixels closest to the one of the two adjacent first sub-pixels intersects the extension line in the first direction and the extension line in the second direction; in a group consisting of two adjacent third sub-pixels in the first direction, a line connecting a vertex of one of the two adjacent third sub-pixels closest to the other of the two adjacent third sub-pixels with a vertex of the other of the two adjacent third sub-pixels closest to the one of the two adjacent third sub-pixels intersects the extension line in the first direction and the extension line in the second direction; and in a group consisting of two adjacent third sub-pixels in the second direction, a line connecting a vertex of one of the two adjacent third sub-pixels closest to the other of the two adjacent third sub-pixels with a vertex of the other of the two adjacent third sub-pixels closest to the one of the two adjacent third sub-pixels intersects the extension line in the first direction and the extension line in the second direction.

In some embodiments, in the group consisting of the one first sub-pixel and the one third sub-pixel adjacent to each other in the first direction, the vertex of the one first sub-pixel closest to the one third sub-pixel and the vertex of the one third sub-pixel closest to the one first sub-pixel are respectively located on either side of a line connecting a center of the one first sub-pixel with a center of the one third sub-pixel.

In some embodiments, in the group consisting of the one first sub-pixel and the one third sub-pixel adjacent to each other in the first direction, the vertex of the one first sub-pixel closest to the one third sub-pixel and the vertex of the one third sub-pixel closest to the one first sub-pixel are distanced from a line connecting the center of the one first sub-pixel with the center of the one third sub-pixel by different distances.

In some embodiments, the vertex of the one first sub-pixel closest to the one third sub-pixel and the vertex of the one third sub-pixel closest to the one first sub-pixel substantially have an equal distance to a line connecting a center of the one first sub-pixel with a center of the one third sub-pixel.

In some embodiments, the first sub-pixel, the second sub-pixel, and the third sub-pixel are in a shape selected from at least one of square or rhombus, first diagonal lines of the first sub-pixels, the second sub-pixel, and the third pixel are parallel to each other, and the second diagonal lines of the first sub-pixel, the second sub-pixel, and the third sub-pixel are parallel to each other.

In some embodiments, an included angle between each of the first diagonal lines and the first direction is substantially greater than 0° and less than 45°, and an included angle between each of the second diagonal lines and the second direction is substantially greater than 0° and less than 45°.

In some embodiments, the second sub-pixel is in a shape of a quadrangle, and an included angle between one diagonal line of the quadrangle and the first direction is substantially greater than 0° and less than 45°, an included angle between the other diagonal line of the quadrangle and the second direction is substantially greater than 0° and less than 45°, both the first sub-pixel and the third sub-pixel are in a shape of a hexagon, and the hexagon is axisymmetric and has two axes of symmetry, and one of the two axes of symmetry is parallel to the first direction, and the other of the two axes of symmetry is parallel to the second direction.

In some embodiments, the second sub-pixel is in a shape of quadrangle, and both the first sub-pixel and the third sub-pixel are in a shape of rectangle, an extending direction of a long side of the first sub-pixel is perpendicular to an extending direction of a long side of the third sub-pixel.

In some embodiments, a line connecting a center of one first sub-pixel with a center of one third sub-pixel is parallel to the first direction, the one first sub-pixel and the one third sub-pixel being adjacent to each other in the first direction, and a line connecting a center of one first sub-pixel with a center of one third sub-pixel is parallel to the second direction, the one first sub-pixel and the one third sub-pixel being adjacent to each other in the second direction.

In some embodiments, at least a part of the first sub-pixels, the second sub-pixels, and the third sub-pixels have rounded corners.

In some embodiments, the first sub-pixel, the second sub-pixel, and the third sub-pixel are a red sub-pixel, a green sub-pixel, and a blue sub-pixel, respectively.

In some embodiments, at least one second sub-pixel is surrounded by two first sub-pixels and two third sub-pixels adjacent thereto.

In some embodiments, the first sub-pixel and the third sub-pixel are in the same shape and have the same area.

In some embodiments, an area of a single second sub-pixel is smaller than an area of a single first sub-pixel or an area of a single third sub-pixel.

Some embodiments of the present disclosure provide a fine metal mask set for manufacturing the display substrate of the above embodiments, wherein the fine metal mask set comprises: a first fine metal mask having a plurality of first opening regions, one of the first opening regions having a shape and a position corresponding to the first sub-pixel; a second fine metal mask having a plurality of second opening regions, one of the second opening regions having a shape and a position corresponding to the second sub-pixel; and a third fine metal mask having a plurality of third opening regions, one of the third opening regions having a shape and a position corresponding to the third sub-pixel.

Some embodiments of the present disclosure provide a display device comprising the display substrate of the above embodiments.

DETAILED DESCRIPTION OF THE EMBODIMENTS

Figure 1:
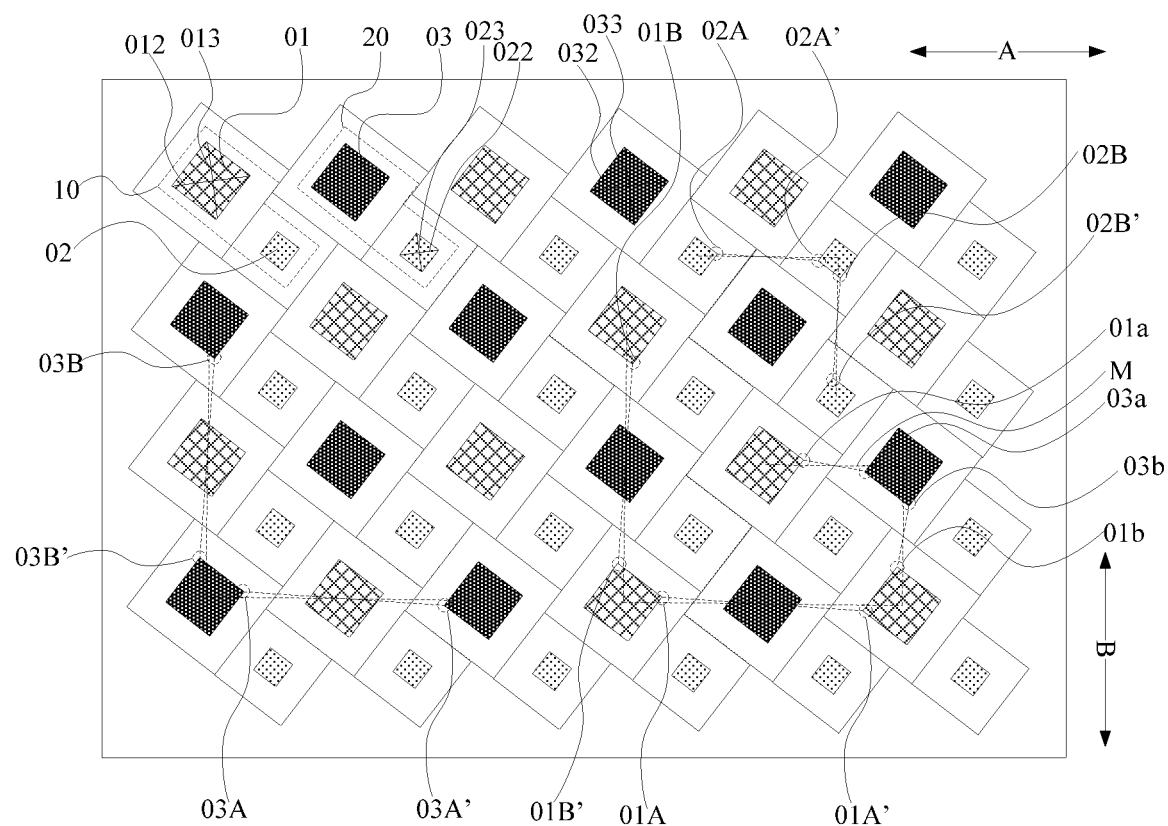
FIG. 1 is a schematic structural view of a display substrate according to some embodiments of the present disclosure.

In order to make the objects, technical solutions and advantages of the present disclosure more clear, the present disclosure will be further described in detail below with reference to the accompanying drawings. It is apparent that the described embodiments are only a part of the embodiments of the present disclosure, and not all of them. All other embodiments obtained by those skilled in the art based on the embodiments of the present disclosure without creative efforts are within the scope of the present disclosure.

The shapes and sizes of the various components in the drawings do not reflect true proportions, and are merely intended to illustrate the present disclosure.

A structure of an OLED display mainly includes: a base substrate, and sub-pixels arranged in a matrix on the base substrate. For each of the sub-pixels, an OLED structure is generally formed at a corresponding sub-pixel position of the display substrate by using an evaporation film forming technique in which an organic material passes through a fine metal mask.

However, in an OLED display of the related art, a distance between sub-pixels in the pixel arrangement structure is large, resulting in a small sub-pixel aperture area under the condition of the same resolution, thus it is necessary to increase an driving current to meet the brightness requirement of display. However, the OLED display working under a large driving current easily leads to an increase in the aging speed of the device, thereby shortening a lifetime of the OLED display.

The present disclosure provides a display substrate, the display substrate includes a plurality of first pixels and a plurality of second pixels alternately arranged in both a first direction and a second direction, the first direction and the second direction intersecting each other, for example, perpendicular to each other. Each of the first pixels includes a first sub-pixel and a second sub-pixel, and each of the second pixels includes a third sub-pixel and a second sub-pixel. The second sub-pixels are uniformly distributed in a matrix. The first sub-pixel and the third sub-pixel are both in a polygonal shape, and are arranged alternately in the first direction and the second direction. for one first sub-pixel and one third sub-pixel adjacent to each other in the first direction, a line connecting a vertex of the one first sub-pixel closest to the one third sub-pixel with a vertex of the one third sub-pixel closest to the one first sub-pixel intersects an extension line in the first direction and an extension line in the second direction, for example, a corner of the one first sub-pixel pixel closest to the one third sub-pixel and a corner of the one third sub-pixel closest to the one first sub-pixel are staggered in the second direction. This kind of sub-pixel arrangement is advantageous for improving the compactness of the sub-pixel arrangement. Compared with a pixel arrangement of the related art, the first sub-pixels, the second sub-pixels and the third sub-pixels may be more closely arranged under the same process condition, a distance between adjacent sub-pixels may be reduced as much as possible, so that the sub-pixel aperture area is increased under the condition of the same resolution, and the driving current of the display device is reduced, thereby increasing the lifetime of the display device.

In the present disclosure, for convenience of presentation, for two adjacent polygons, a vertex of one polygon closest to the other polygon and a vertex of the other polygon closest to the one polygon are referred to as adjacent vertexes of the two adjacent polygons, a corner of one polygon closest to the other polygon and a corner of the other polygon closest to the one polygon are referred to as adjacent corners of the two adjacent polygons.

Figure 5:
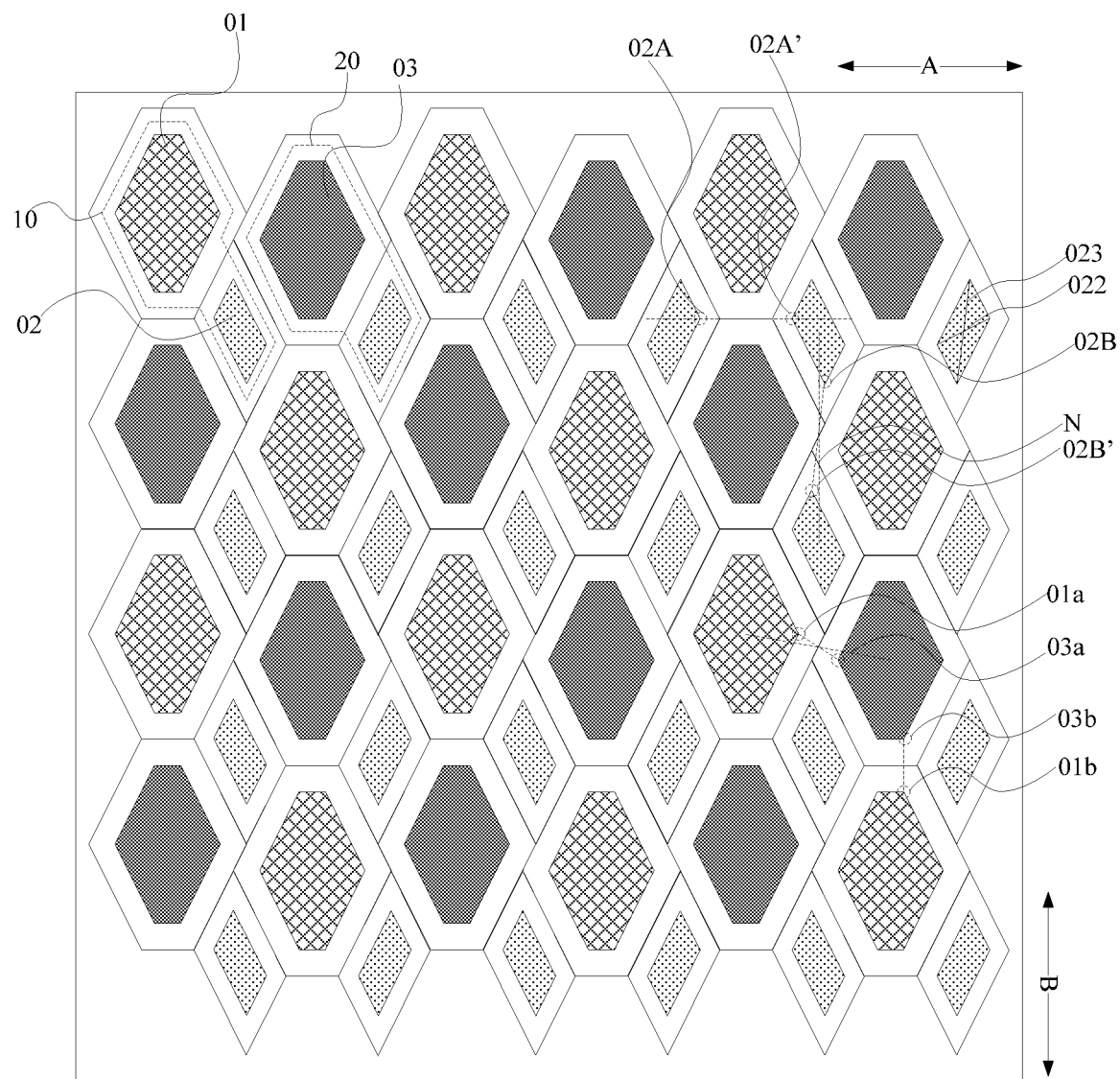
FIG. 5 is a schematic structural view of a display substrate according to some embodiments of the present disclosure.
Figure 9:
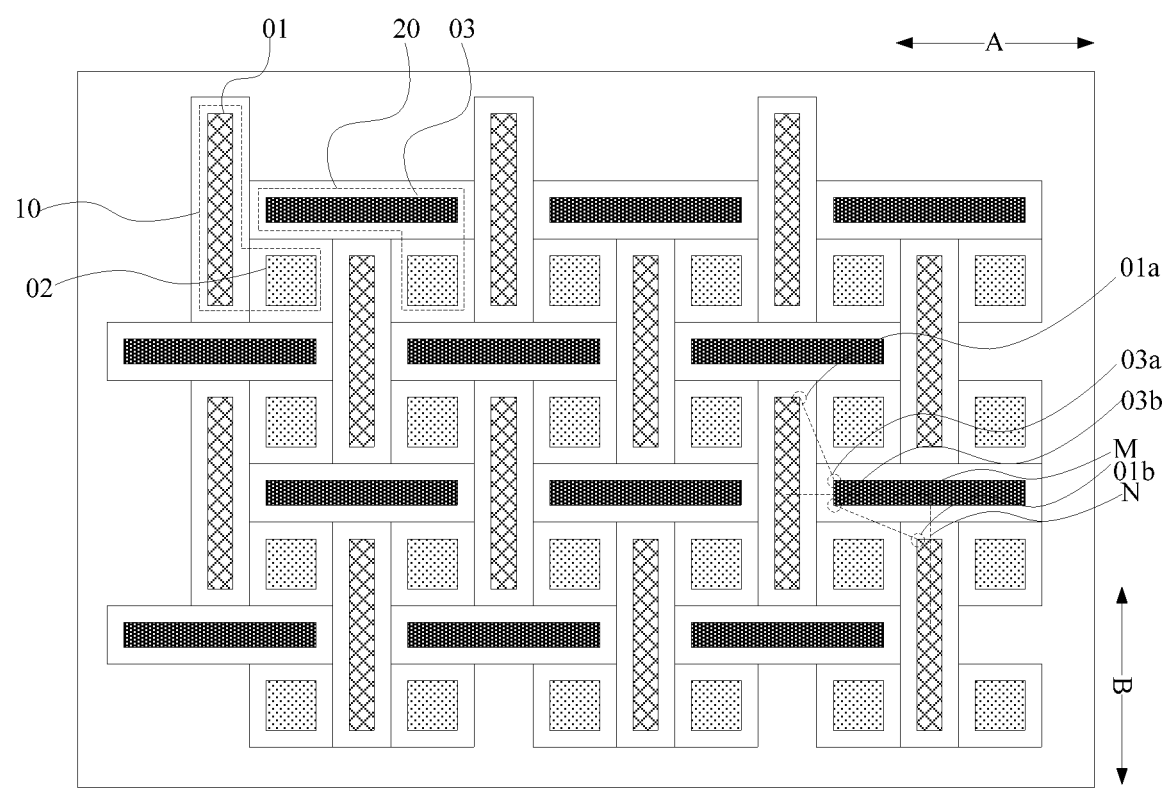
FIG. 9 is a schematic structural view of a display substrate according to some embodiments of the present disclosure.

Some embodiments of the present disclosure provides a display substrate, as shown in FIG. 1, FIG. 5 and FIG. 9, the display substrate includes: a plurality of first pixels 10 and a plurality of second pixels 20 alternately arranged in a first direction A, for example, a row direction and a second direction B, for example, a column direction.

Each of the first pixels 10 includes a first sub-pixel 01 and a second sub-pixel 02, each of the second pixels 20 includes a third sub-pixel 03 and a second sub-pixel 02.

The second sub-pixels 02 are evenly distributed in a matrix, and each of the second sub-pixels 02 is surrounded by two first sub-pixels 01 and two third sub-pixels 03 adjacent thereto.

The first sub-pixel 01 and the third sub-pixel 03 are both in a polygonal shape, and are alternately arranged in the first direction A and the second direction B. For one first sub-pixel 01 and one third sub-pixel 03 adjacent to each other in the first direction A, a corner 01a of the one first sub-pixel 01 closest to the one third sub-pixel 03 and a corner 03a of the one third sub-pixel 03 closest to the one first sub-pixel 01 (such a group of two corners (01a and 03a) are referred to as adjacent corners of the one first sub-pixel 01 and the one third sub-pixel 03 adjacent to each other in the first direction A) are staggered in the second direction B, and vertexes of the corners 01a and 03a are referred to as adjacent vertexes of the one first sub-pixel 01 and the one third sub-pixel 03. A line connecting such two adjacent vertexes intersects an extension line in the first direction A and an extension line in the second direction B.

Specifically, in the above display substrates provided by the embodiments of the present disclosure, each second sub-pixel 02 and two first sub-pixels 01 and two third sub-pixels 03 arranged therearound constitute a windmill-like structure, so that the first sub-pixel 01 and the third sub-pixel 03 are alternately arranged in the first direction A and/or the second direction B. Thus, in a first fine metal mask FMM1 for manufacturing the first sub-pixels 01 or a third fine metal mask FMM3 for manufacturing the third sub-pixels 03, the aperture ratio of fine metal mask may be increased in a case where there is a set process pitch between the opening regions adjacent to each other in the first direction A and/or the second direction B, thereby improving the display resolution of the display substrate.

Specifically, in order to facilitate the understanding of the present disclosure, corresponding relationships between the first sub-pixel 01, the second sub-pixel 02, and the third sub-pixel 03 and the opening regions of the fine metal mask FMM to which the first sub-pixel 01, the second sub-pixel 02, and the third sub-pixel 03 correspond respectively are also shown in FIG. 1, FIG. 5, and FIG. 9. A shape of the opening region is consistent with that of the sub-pixel to which the opening region corresponds, and a size of the opening region is usually larger than that of the sub-pixel to which the opening region corresponds.

Figure 2:
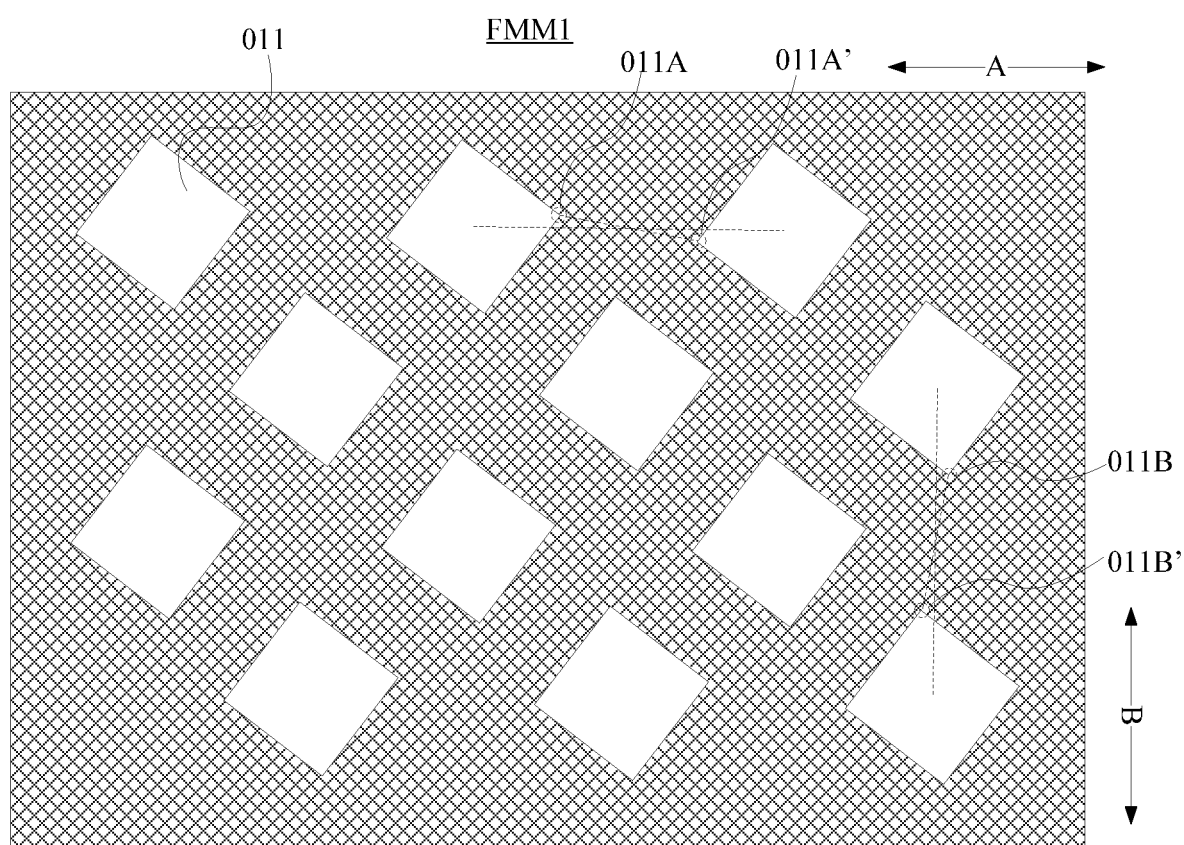
FIG. 2 is a schematic structural view of a first fine metal mask corresponding to a first sub-pixel shown in FIG. 1 according to some embodiments of the present disclosure.
Figure 3:
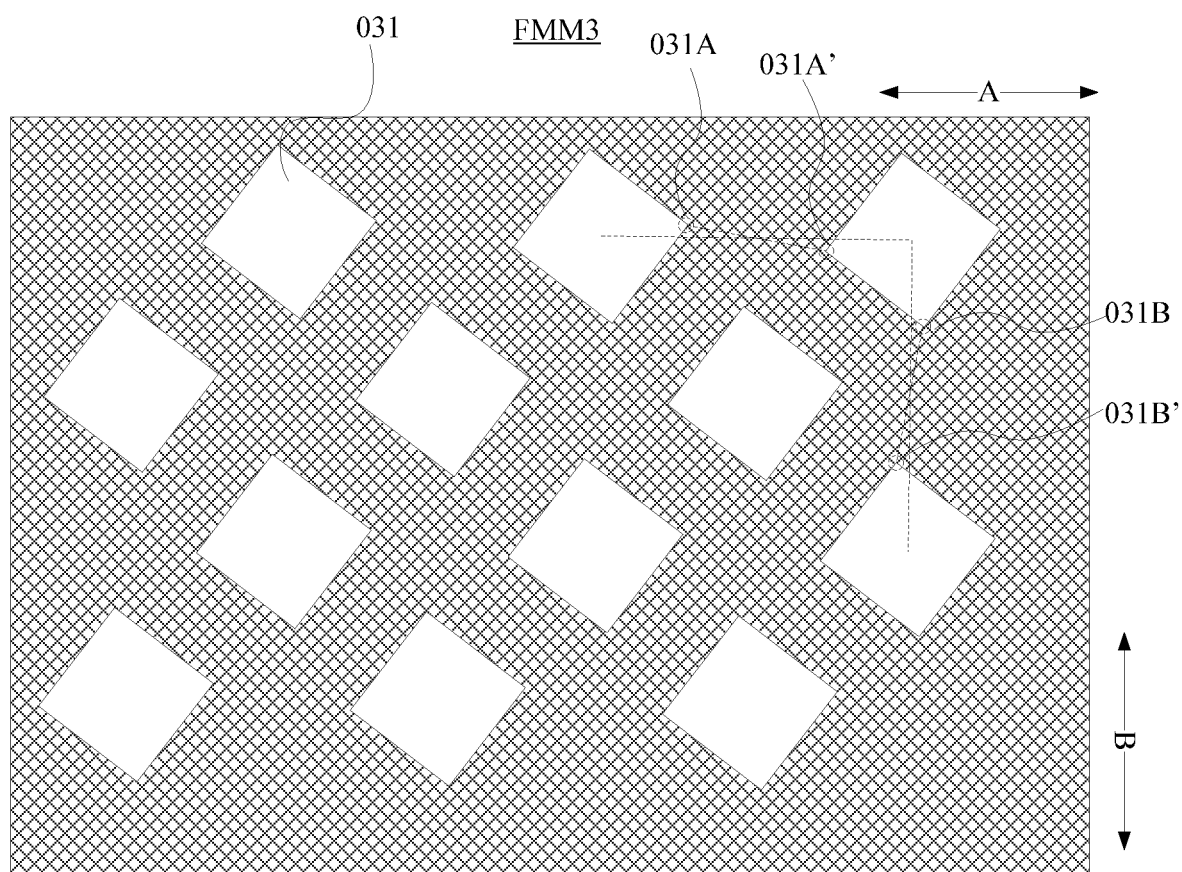
FIG. 3 is a schematic structural view of a third fine metal mask corresponding to a third sub-pixel shown in FIG. 1 according to some embodiments of the present disclosure.
Figure 4:
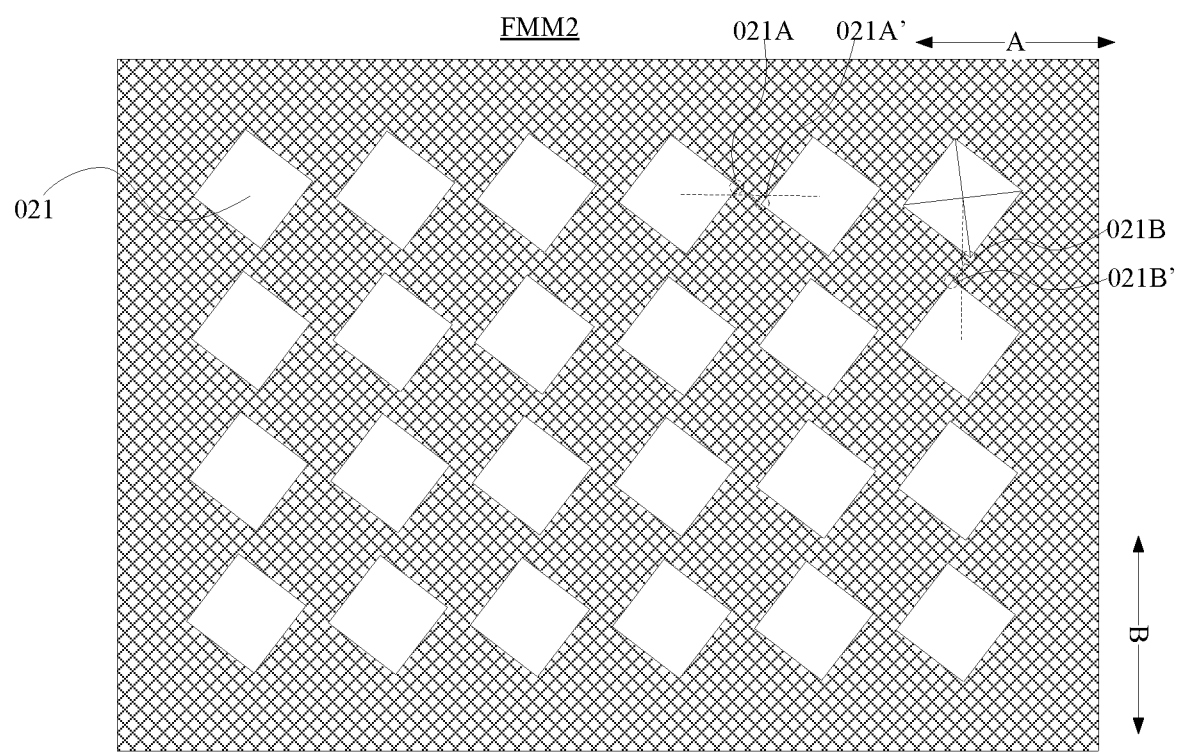
FIG. 4 is a schematic structural view of a second fine metal mask corresponding to a second sub-pixel shown in FIG. 1 according to some embodiments of the present disclosure.

Specifically, FIG. 2 shows a structure of a first fine metal mask FMM1 for manufacturing the first sub-pixel 01 in FIG. 1, and FIG. 3 shows a structure of a third fine metal mask FMM3 for manufacturing the third sub-pixel 03 in FIG. 1, and FIG. 4 shows a structure of a second fine metal mask FMM2 for manufacturing the second sub-pixel 02 in FIG. 1. As shown in FIG. 2, in the first fine metal mask FMM1, two adjacent rows of first opening regions 011 are staggered in the first direction A, and two adjacent columns of first opening regions 011 are staggered in the second direction B. As shown in FIG. 3, in the third fine metal mask FMM3, two adjacent rows of third opening regions 031 are staggered in the first direction A, and two adjacent columns of third opening regions 031 are staggered in the second direction B. As shown in FIG. 4, in the second fine metal mask FMM2, second opening regions 021 are arranged in a matrix.

Figure 6:
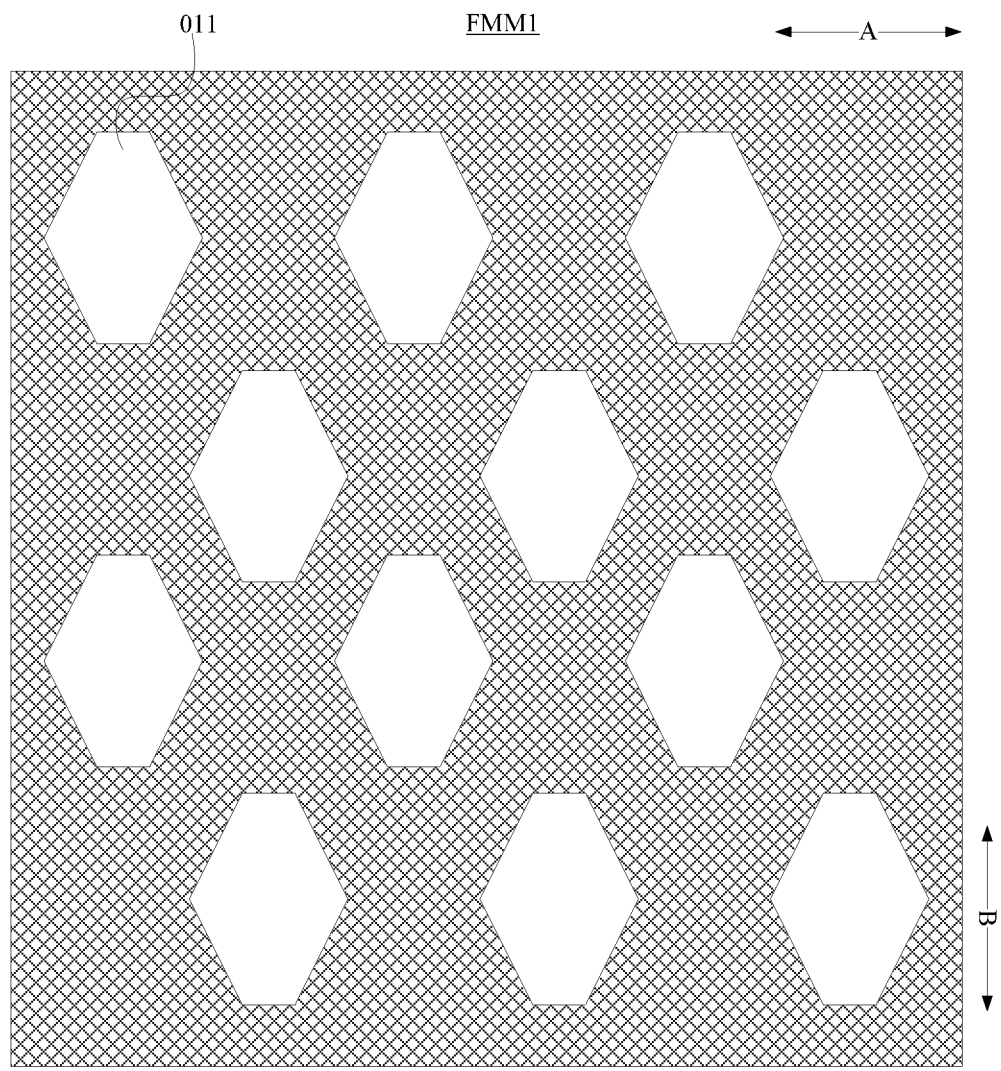
FIG. 6 is a schematic structural view of a first fine metal mask corresponding to a first sub-pixel shown in FIG. 5 according to some embodiments of the present disclosure.
Figure 7:
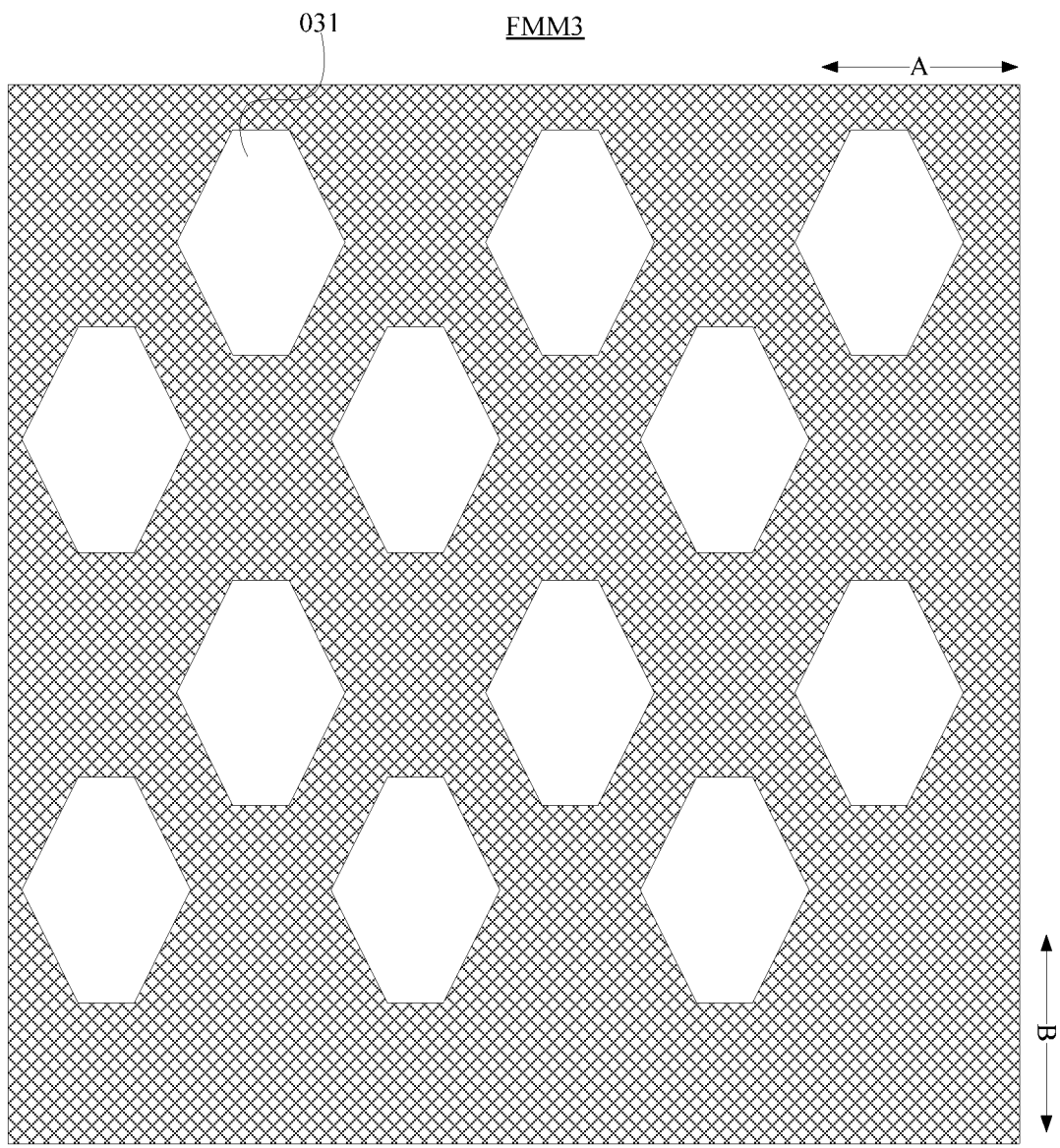
FIG. 7 is a schematic structural view of a third fine metal mask corresponding to a third sub-pixel shown in FIG. 5 according to some embodiments of the present disclosure.
Figure 8:
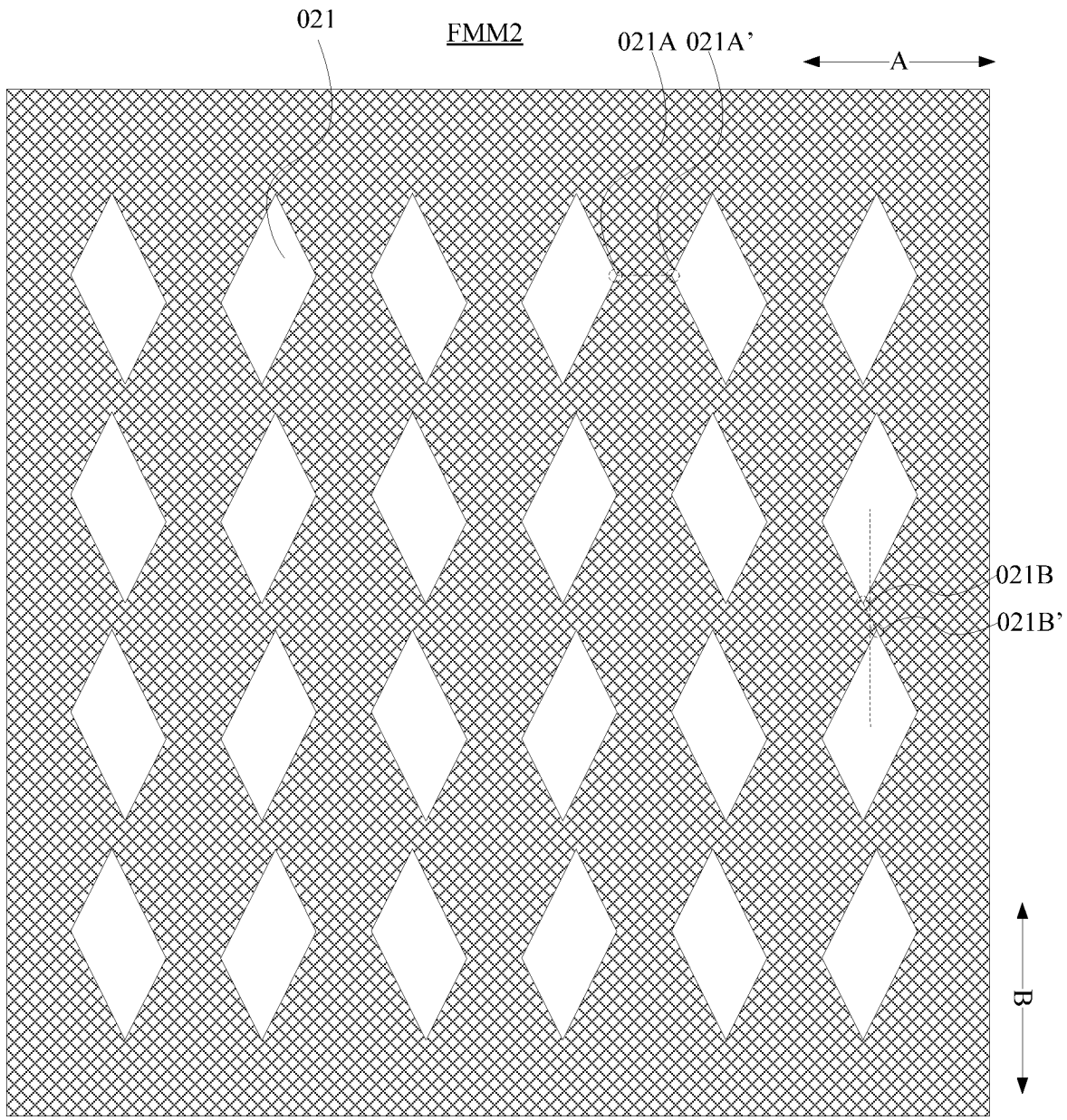
FIG. 8 is a schematic structural view of a second fine metal mask corresponding to a second sub-pixel shown in FIG. 5 according to some embodiments of the present disclosure.

Specifically, FIG. 6 shows a structure of a first fine metal mask FMM1 for manufacturing the first sub-pixel 01 in FIG. 5, FIG. 7 shows a structure of a third fine metal mask FMM3 for manufacturing the third sub-pixel 03 in FIG. 5, and FIG. 8 shows a structure of a second fine metal mask FMM2 for manufacturing the second sub-pixel 02 in FIG. 5. As shown in FIG. 6, in the first fine metal mask FMM1, two adjacent rows of first opening regions 011 are staggered in the first direction A, and two adjacent columns of first opening regions 011 are staggered in the second direction B. As shown in FIG. 7, in the third fine metal mask FMM3, two adjacent rows of third opening regions 031 are staggered in the first direction A, and two adjacent columns of third opening regions 031 are staggered in the second direction B. As shown in FIG. 8, in the second fine metal mask FMM2, second opening regions 021 are arranged in a matrix, and any two adjacent second opening regions 021 in the first direction A are arranged in mirror symmetry.

Figure 10:
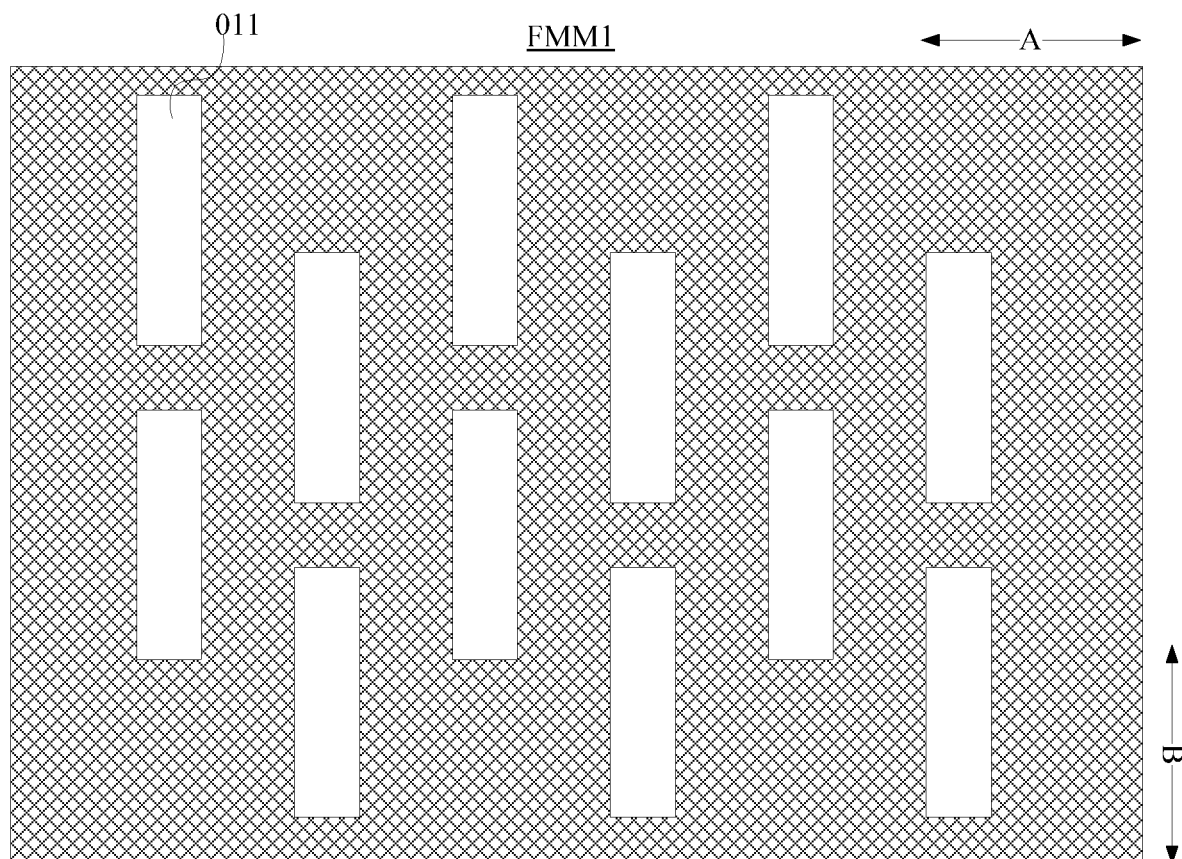
FIG. 10 is a schematic structural view of a first fine metal mask corresponding to a first sub-pixel shown in FIG. 9 according to some embodiments of the present disclosure.
Figure 11:
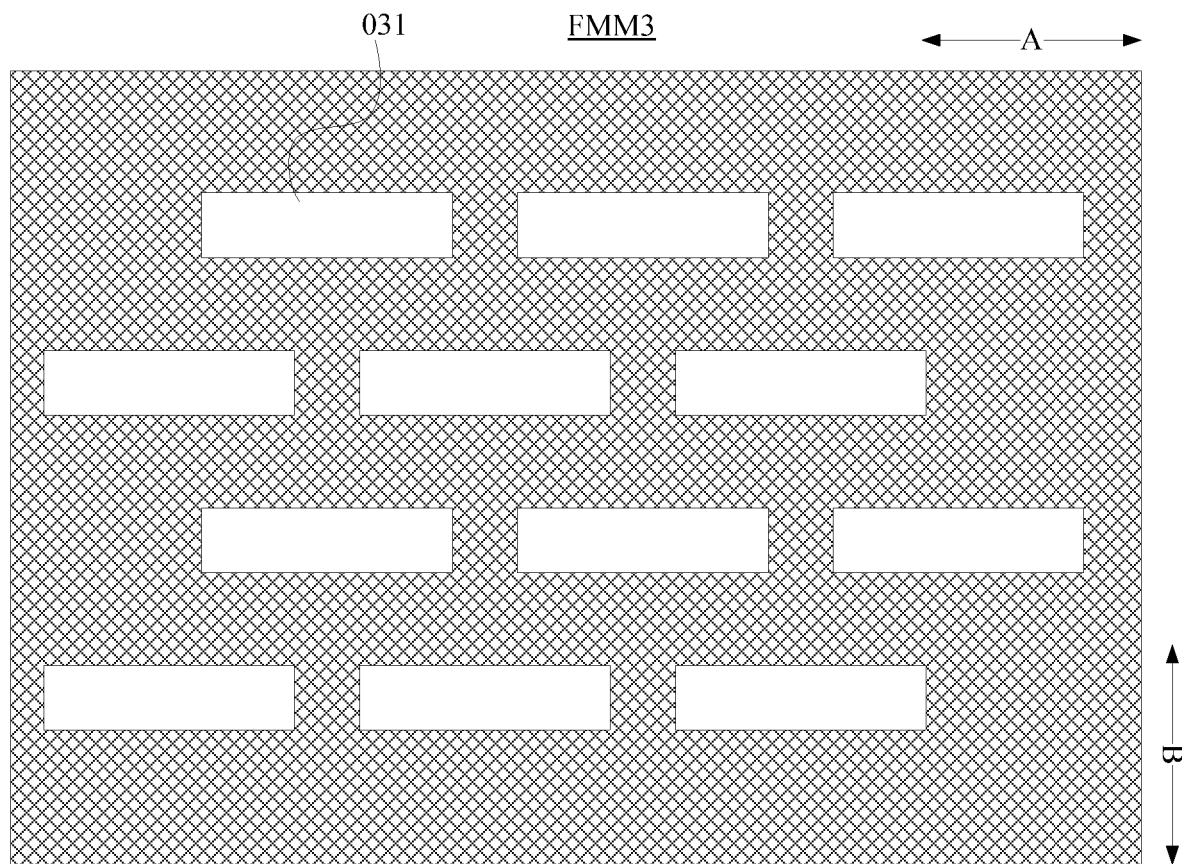
FIG. 11 is a schematic structural view of a third fine metal mask corresponding to a third sub-pixel shown in FIG. 9 according to some embodiments of the present disclosure.
Figure 12:
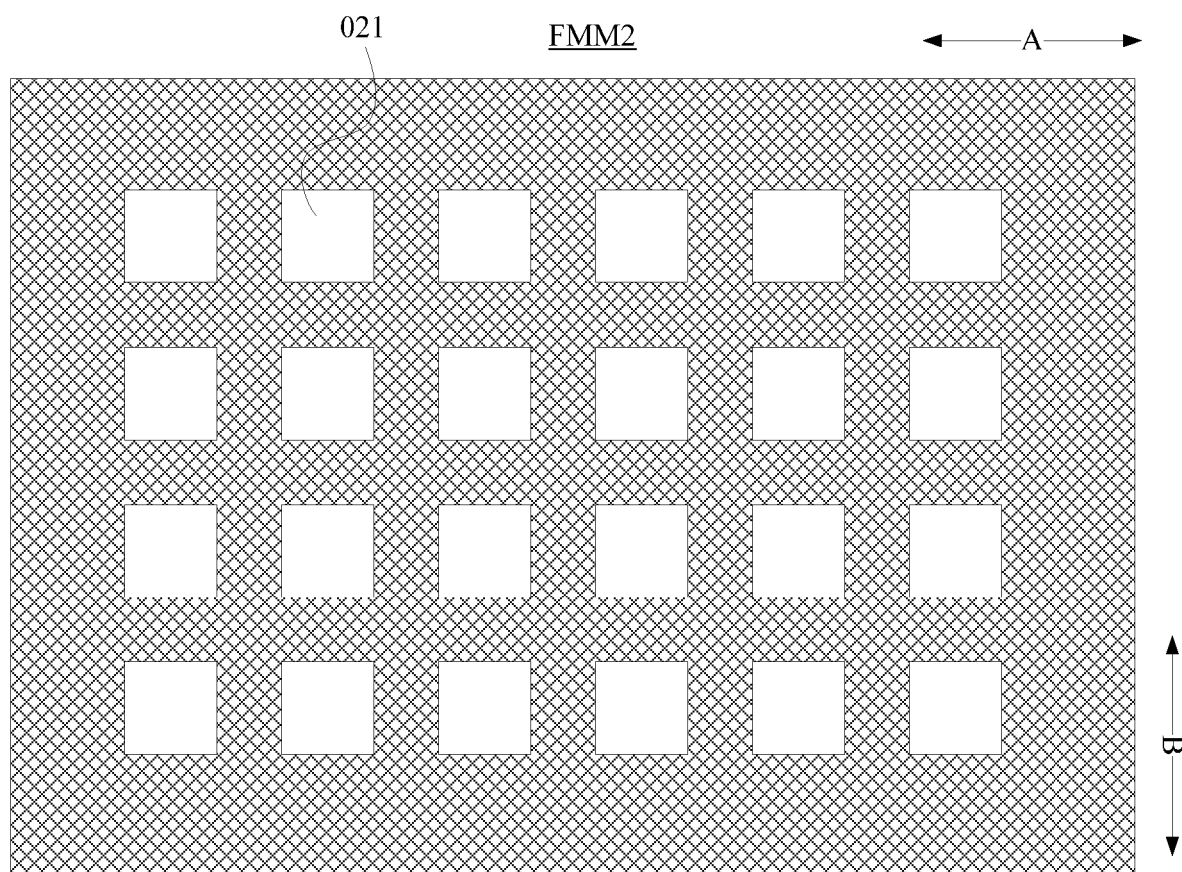
FIG. 12 is a schematic structural view of a second fine metal mask corresponding to a second sub-pixel shown in FIG. 9 according to some embodiments of the present disclosure.

Specifically, FIG. 10 shows a structure of a first fine metal mask FMM1 for manufacturing the first sub-pixel 01 in FIG. 9, FIG. 11 shows a structure of a third fine metal mask FMM3 for manufacturing the third sub-pixel 03 in FIG. 9, and FIG. 12 shows a structure of a second fine metal mask FMM2 for manufacturing the second sub-pixel 02 in FIG. 9. As shown in FIG. 10, in the first fine metal mask FMM1, two adjacent rows of first opening regions 011 are staggered in the first direction A, and two adjacent columns of first opening regions 011 are staggered in the second direction B. As shown in FIG. 11, in the third fine metal mask FMM3, two adjacent rows of third opening regions 031 are staggered in the first direction A, and two adjacent columns of third opening regions 031 are staggered in the second direction B. As shown in FIG. 12, second opening regions 021 are arranged in a matrix, and any two adjacent second opening regions 021 in the first direction A are arranged in mirror symmetry.

In addition, in the above display substrates provided by the embodiments of the present disclosure, compared with the pixel arrangement of the related art, the pixel arrangement of the windmill-like structure may make the first sub-pixel 01, the second sub-pixel 02 and the third sub-pixel 03 closely arranged under the same process conditions, and reduce the distance between adjacent sub-pixels as much as possible. Moreover, for one first sub-pixel 01 and one third sub-pixel 03 adjacent to each other in the first direction A, a corner 01a of the one first sub-pixel 01 closest to the one third sub-pixel 03 and a corner 03a of the one third sub-pixel 03 closest to the one first sub-pixel 01 are staggered in the second direction B. Vertexes of the corner 01a and the corner 03a are adjacent corners of the one first sub-pixel 01 and the one third sub-pixel 03. A line connecting the adjacent vertexes intersects an extension line in the first direction A and an extension line in the second direction B. In this way, the compactness of the sub-pixel arrangement is improved, the sub-pixel aperture area is increased under the condition of the same resolution, and the driving current of the display device is reduced, thereby increasing the lifetime of the display device.

It should be noted that it refers to an arrangement of pixels in a middle area of the display substrate that each of the second sub-pixels 02 mentioned in the above display substrates provided by the embodiments of the present disclosure is surrounded by two first sub-pixels 01 and two third sub-pixels 03 adjacent thereto. There may be some special cases at the edge of the display substrate, for example, the second sub-pixels 02 are disposed at the edge of the display substrate. In this case, the each of the second sub-pixels 02 may be adjacent to only one first sub-pixel 01 and one third sub-pixel 03, and is not completely surrounded by the first sub-pixel 01 and the third sub-pixel 03 adjacent thereto.

Optionally, in the above display substrates provided by the embodiments of the present disclosure, as shown in FIG. 1 and FIG. 9, for one first sub-pixel 01 and one third sub-pixel 03 adjacent to each other in the second direction B, a corner 01b of the one first sub-pixel 01 closest to the one third sub-pixel 03 and a corner 03b of the one third sub-pixel 03 closest to the one first sub-pixel 01 (such a group of two corners (01b and 03b) are referred to as adjacent corners of the one first sub-pixel 01 and the one third sub-pixel 03 adjacent to each other in the second direction B) are staggered in the first direction A. Vertexes of the corner 01b and the corner 03b are referred to as adjacent vertexes of the one first sub-pixel 01 and the one third sub-pixel 03. A line connecting such two adjacent vertexes intersects an extension line in the first direction A and an extension line in the second direction B. By using this kind of pixel arrangement, the compactness of the sub-pixel arrangement is improved, the sub-pixel aperture area is increased under the condition of the same resolution, and the driving current of the display device is reduced, thereby increasing the lifetime of the display device.

Optionally, in the above display substrates provided by the embodiments of the present disclosure, as shown in FIG. 5, for one first sub-pixel 01 and one third sub-pixel 03 adjacent to each other in the second direction B, a corner 01b of the one first sub-pixel 01 closest to the one third sub-pixel 03 and a corner 03b of the one third sub-pixel 03 closest to the one first sub-pixel 01 are aligned in the first direction A. Vertexes of the corner 01b and the corner 03b are referred to as adjacent vertexes of the one first sub-pixel 01 and the one third sub-pixel 03. A line connecting such two adjacent vertexes is parallel to the extension line in the second direction B.

At present, each sub-pixel in the OLED display device is obtained by evaporation of an organic material through a corresponding opening region of the fine metal mask FMM, and the size of the opening region of the fine metal mask directly determines the size of the sub-pixel. The size of the sub-pixel will be smaller than the corresponding opening region on the fine metal mask FMM. Based on the limitations of preparation process of the fine metal mask of the related art, it is difficult to obtain a higher-resolution display device by the pixel arrangement of the related art.

Based on this, optionally, in the above display substrates provided by the embodiments of the present disclosure, as shown in FIG. 1 and FIG. 5, each of the second sub-pixels 02 arranged in a matrix generally is in a shape of polygon. For two adjacent second sub-pixels in the second direction B, a corner 02B of one second sub-pixel 02 closest to the other second sub-pixel 02 and a corner 02B' of the other second sub-pixel 02 closest to the one second sub-pixel 02 (such a group of two corners (02B and 02B') are referred to as adjacent corners of the two adjacent second sub-pixels 02 in the second direction B) are staggered in the first direction A. Vertexes of the corner 02B and the corner 02B' are referred to as adjacent vertexes of the two adjacent second sub-pixels 02. A line connecting such two adjacent vertexes intersects the extension line in the first direction A and the extension line in the second direction B. Thus, for corresponding opening regions 021 of the second fine metal mask FMM2 for manufacturing the second sub-pixels 02, as shown in FIGS. 4 and 8, adjacent corners 021B and 021B' of two adjacent second opening regions 021 in the second direction B need to be staggered in the first direction A, and vertexes of the corners 021B and 021B' are adjacent vertexes of the two adjacent second opening regions 021. A line connecting such two adjacent vertexes intersects the extension line in the first direction A and the extension line in the second direction B. In this way, the aperture ratio of the second fine metal mask FMM2 may be increased in a case where there is a set process pitch between the second opening regions 021 adjacent to each other in the second direction B, thereby improving the display resolution of the display substrate.

It is to be noted that, in the above display substrates provided by the embodiments of the present disclosure, the first sub-pixel 01, the second sub-pixel 02, and the third sub-pixel 03 all are in a shape of polygon, and the polygon refers to a shape including at least three sides. The polygon may be a concave polygon or a convex polygon, which is not limited herein. In addition, the corner of each sub-pixel described in the present disclosure refers to the corner of the polygon.

Optionally, in the above display substrates provided by the embodiments of the present disclosure, as shown in FIG. 1, adjacent corners 02A and 02A' of two adjacent second sub-pixels 02 in the first direction A may be staggered in the second direction B. Vertexes of the corners 02A and 02A are the adjacent vertexes of the two adjacent second sub-pixels 02. A line connecting the adjacent vertexes intersects the extension line in the first direction A and the extension line in the second direction B. Thus, for corresponding opening regions 021 of the second fine metal mask FMM2 for manufacturing the second sub-pixels 02, as shown in FIG. 4, adjacent corners 021A and 021A' of two adjacent second opening regions 021 in the first direction A need to be staggered in the second direction B, and vertexes of the corners 021A and 021A' are adjacent vertexes of the two adjacent second opening regions 021. A line connecting the adjacent vertexes intersects the extension line in the first direction A and the extension line in the second direction B. In this way, the aperture ratio of the second fine metal mask FMM2 may be increased in a case where there is a set process pitch between the second opening regions 021 adjacent to each other in the first direction A, thereby improving the display resolution of the display substrate.

Optionally, in the above display substrates provided by the embodiments of the present disclosure, as shown in FIG. 5, adjacent corners 02A and 02A' of two adjacent second sub-pixels 02 in the first direction A may be aligned in the second direction B. Vertexes of the corners 02A and 02A are the adjacent vertexes of the two adjacent second sub-pixels 02. A line connecting such two adjacent vertexes is parallel to the extension line in the second direction B. Thus, for corresponding opening regions 021 of the second fine metal mask FMM2 for manufacturing the second sub-pixels 02, as shown in FIG. 8, adjacent corners 021A and 021A' of two adjacent second opening regions 021 in the first direction A need to be aligned in the second direction B.

Optionally, in the above display substrates provided by the embodiments of the present disclosure, as shown in FIG. 1, adjacent corners 03B and 03B' of two adjacent third sub-pixels 03 in the second direction B may be staggered in the first direction A. Vertexes of the corners 03B and 03B' are the adjacent vertexes of the two adjacent third sub-pixels 03 in the second direction B. A line connecting the adjacent vertexes intersects the extension line in the first direction A and the extension line in the second direction B. Further, adjacent corners 03A and 03A' of two adjacent third sub-pixels 03 in the first direction A may be staggered in the second direction B. Vertexes of the corners 03A and 03A' are the adjacent vertexes of the two adjacent third sub-pixels 03 in the first direction A. A line connecting the adjacent vertexes intersects the extension line in the first direction A and the extension line in the second direction B. Thus, for corresponding third opening regions 031 of the third fine metal mask FMM3 for manufacturing the third sub-pixels 03, as shown in FIG. 3, adjacent corners 031B and 031B' of two adjacent third opening regions 031 in the second direction B need to be staggered in the first direction A, and vertexes of the corners 031B and 031B' are adjacent vertexes of the two adjacent third opening regions 031. A line connecting the adjacent vertexes intersects the extension line in the first direction A and the extension line in the second direction B. Further, adjacent corners 031A and 031A' of two adjacent third opening regions 031 in the first direction A need to be staggered in the second direction B, and vertexes of the corners 031A and 031A' are adjacent vertexes of the two adjacent third opening regions 031. A line connecting the adjacent vertexes intersects the extension line in the first direction A and the extension line in the second direction B. In this way, the aperture ratio of the third fine metal mask FMM3 may be increased in a case where there is a set process pitch between two adjacent third opening regions 031, thereby improving the display resolution of the display substrate.

Optionally, in the above display substrates provided by the embodiments of the present disclosure, as shown in FIG. 1, adjacent corners 01A and 01A' of two adjacent first sub-pixels 01 in the first direction A may be staggered in the second direction B. Vertexes of the corners 01A and 01A' are the adjacent vertexes of the two adjacent first sub-pixels 01 in the first direction A. A line connecting the adjacent vertexes intersects the extension line in the first direction A and the extension line in the second direction B. Further, adjacent corners 01B and 01B' of two adjacent first sub-pixels 03 in the second direction B may be staggered in the first direction A. Vertexes of the corners 01B and 01B' are the adjacent vertexes of the two adjacent first sub-pixels 01 in the second direction B. A line connecting the adjacent vertexes intersects the extension line in the first direction A and the extension line in the second direction B. In this case, for corresponding first opening regions 011 of the first fine metal mask FMM1 for manufacturing the first sub-pixels 01, as shown in FIG. 2, adjacent corners 011A and 011A' of two adjacent first opening regions 031 in the first direction A need to be staggered in the second direction B, and vertexes of the corners 011A and 011A' are adjacent vertexes of the two adjacent first opening regions 011. A line connecting the adjacent vertexes intersects the extension line in the first direction A and the extension line in the second direction B. Further, adjacent corners 011B and 011B' of two adjacent first opening regions 011 in the second direction B need to be staggered in the first direction A, and vertexes of the corners 011B and 011B' are adjacent vertexes of the two adjacent first opening regions 011. A line connecting the adjacent vertexes intersects the extension line in the first direction A and the extension line in the second direction B. In this way, the aperture ratio of the first fine metal mask FMM1 may be increased in a case where there is a set process pitch between the first opening regions 011 adjacent to each other, thereby improving the display resolution of the display substrate.

It should be noted that, in the above display substrates provided by the embodiments of the present disclosure, adjacent corners of two adjacent sub-pixels (such as one first sub-pixel and one third sub-pixel adjacent to each other, two adjacent first sub-pixels, two adjacent second sub-pixels or two adjacent third sub-pixels) in one direction, for example the first direction or the second direction, being staggered in another direction, such as the second direction or the first direction refers to that a line connecting vertexes of the adjacent corners of two adjacent sub-pixels is inclined with respect to the one direction. That is, there is a certain included angle between an extension line of the line and an extension line in the one direction. The included angle is substantially greater than zero and less than 90 degrees. Moreover, in general, the vertexes of the adjacent corners of the two adjacent sub-pixels are the closest points of the two adjacent sub-pixels, thus it is also refers to that the extension line of the line connecting two vertexes intersects the extension line in the one direction.

Optionally, in the above display substrates provided by the embodiments of the present disclosure, the staggered arrangement in the second direction B may refers to that the vertexes of the adjacent corners of the two adjacent sub-pixels in the first direction A are respectively located on upper and lower sides of a first imaginary line parallel to the first direction A, or the staggered arrangement in the second direction B may refers to that the vertexes of the adjacent corners of the two adjacent sub-pixels in the first direction A are distanced from the first imaginary line parallel to the first direction A by different distances.

Optionally, in the above display substrates provided by the embodiments of the present disclosure, the first imaginary line is generally a line connecting centers of two adjacent sub-pixels in the first direction A.

In the present disclosure, the center may be any one of an intersection point of perpendicular bisectors, a center of gravity, or a symmetry center of the sub-pixel Optionally, in the above display substrates provided by the embodiments of the present disclosure, the staggered arrangement in the second direction B may be that the vertexes of the adjacent corners of the two adjacent sub-pixels in the first direction A are respectively located on upper and lower sides of the first imaginary line, for example, a line connecting centers of the adjacent two sub-pixels, parallel to the first direction A, and the vertexes of the adjacent corners are distanced from the first imaginary line by the same distance.

Specifically, for example, as shown in FIG. 1, vertexes of adjacent corners 01a and 03a of one first sub-pixel 01 and one third sub-pixel 03 adjacent to each other in the first direction A are respectively located on the upper and lower sides of a line M connecting centers of the one first sub-pixel 01 and the one third sub-pixel 03. The vertexes of the adjacent corners 01a and 03a of the one first sub-pixel 01 and the one third sub-pixel 03 have the same distance to the line M connecting the centers of the one first sub-pixel 01 and the one third sub-pixel 03. For another example, as shown in FIG. 9, vertexes of adjacent corners 01a and 03a of one first sub-pixel 01 and one third sub-pixel 03 adjacent to each other are distanced from a line M connecting centers of the one first sub-pixel 01 and the one third sub-pixel 03 (i.e. the first imaginary line) by different distances.

Optionally, in the above display substrates provided by the embodiments of the present disclosure, the staggered arrangement in the first direction A may refers to that the vertexes of the adjacent corners of the two adjacent sub-pixels in the second direction B are respectively located on left and right sides of a second imaginary line parallel to the second direction B, or the staggered arrangement in the first direction A may refers to that the vertexes of the adjacent corners of the two adjacent sub-pixels in the second direction B are distanced from the second imaginary line parallel to the second direction B by different distances.

Optionally, in the above display substrates provided by the embodiments of the present disclosure, the second imaginary line is a line connecting centers of two adjacent sub-pixels in the second direction.

Optionally, in the above display substrates provided by the embodiments of the present disclosure, the staggered arrangement in the first direction A may be may be that the vertexes of the adjacent corners of the two adjacent sub-pixels in the second direction B are respectively located on left and right sides of the second imaginary line, for example, a line connecting centers of the adjacent two sub-pixels, parallel to the second direction B, and the vertexes of the adjacent corners have the same distance to the second imaginary line.

Specifically, for example, as shown in FIG. 5, vertexes of adjacent corners 02B and 02B' of two adjacent second sub-pixels 02 in the second direction B are respectively located on the left and right sides of a line N connecting centers of the two adjacent second sub-pixels 02. The vertexes of the adjacent corners 02B and 02B' of the two adjacent second sub-pixels 02 in the second direction B have the same distance to the line N connecting the centers of the two adjacent second sub-pixels 02. For another example, as shown in FIG. 9, vertexes of the adjacent corners 01b and 03b of one first sub-pixel 01 and one third sub-pixel 03 adjacent to each other in the second direction B are distanced from a line N connecting centers of the one first sub-pixel 01 and the one third sub-pixel 03 by different distances.

Optionally, in the above display substrates provided by the embodiments of the present disclosure, as shown in FIG. 9, the first sub-pixel 01 and the third sub-pixel 03 are all elongated, and extension lines of long sides of the first sub-pixel 01 and the third sub-pixel 03 may intersect. In this case, vertexes of adjacent corners 01a and 03a of one first sub-pixel 01 and one third sub-pixel 03 adjacent to each other in the first direction A are located on the same side of a line connecting centers of the one first sub-pixel 01 and the one third sub-pixel 03, and are distanced from the line connecting the centers by different distances. Similarly, vertexes of adjacent corners 01b and 03b of one first sub-pixel 01 and one third sub-pixel 03 adjacent to each other in the second direction B are located on the same side of a line connecting centers of the one first sub-pixel 01 and the one third sub-pixel 03, and are distanced from the line connecting the centers by different distances.

Optionally, in the above display substrates provided by the embodiments of the present disclosure, the first sub-pixel and the third sub-pixel may be in the same shape and have the same area, and the second sub-pixel has an area smaller than that of the first sub-pixel or the third sub-pixel. As shown in FIG. 1, the first sub-pixel 01, the second sub-pixel 02, and the third sub-pixel 03 all are in a shape of square, and the first sub-pixel 01 and the third sub-pixel 03 have the same area, and the area of the second sub-pixel 02 is smaller than that of the first sub-pixel 01 or the third sub-pixel 03. As shown in FIG. 5, the first sub-pixel 01 and the third sub-pixel 03 are both hexagonal, and are in the same shape and have the same area. The second sub-pixel 02 is in a shape of quadrangle, such as parallelogram, and the area of the second sub-pixel 02 is smaller than that of the first sub-pixel 01 or the third sub-pixel 03. As shown in FIG. 9, the first sub-pixel 01 and the third sub-pixel 03 are both rectangular, and are in the same shape and have the same area. The second sub-pixel 02 is in a shape of quadrangle, such as square, and the area of the second sub-pixel 02 is smaller than that of the first sub-pixel 01 or the third sub-pixel 03.

Optionally, in the above display substrates provided by the embodiments of the present disclosure, a ratio of a total area of all the first sub-pixels, a total area of all the second sub-pixels, and a total area of all the third sub-pixels is 1:1.15 to 1.4:1.3 to 1.6.

Optionally, in the above display substrates provided by the embodiments of the present disclosure, a ratio of a total area of all the first sub-pixels, a total area of all the second sub-pixels, and a total area of all the third sub-pixels is 1:1.2 to 1.3:1.4 to 1.5.

Optionally, in the above display substrates provided by the embodiments of the present disclosure, a ratio of a total area of all the first sub-pixels, a total area of all the second sub-pixels, and a total area of all the third sub-pixels is 1:1.27:1.46.

Optionally, in the above display substrates provided by the embodiments of the present disclosure, as shown in FIG. 1, the first sub-pixel 01, the second sub-pixel 02, and the third sub-pixel 03 all are in a shape of square, and first diagonal lines 012, 022, and 032 of the first sub-pixel 01, the second sub-pixel 02 and the third sub-pixel 03 may be parallel to each other, and the second diagonal lines 013, 023 and 033 of the first sub-pixel 01, the second sub-pixel 02 and the third sub-pixel 03 may be parallel to each other. An included angle between the first direction A and the first diagonal lines 012, 022, 032 of the first sub-pixel 01, the second sub-pixel 02, and the third sub-pixel 03 is substantially greater than 0° and less than 45°, and an included angle between the second direction B and the second diagonal lines 012, 022, 032 of the first sub-pixel 01, the second sub-pixel 02 and the third sub-pixel 03 is substantially greater than 0° and less than 45°. It should be noted that corners of the square may be rounded corners, and an approximate square with a certain error on side length or angle belongs to the protection scope of the present disclosure. In addition, as shown in FIG. 1, the line connecting centers of one first sub-pixel 01 and one third sub-pixel 03 adjacent to each other in the first direction A is parallel to the first direction A, and the line connecting centers of one first sub-pixel 01 and one third sub-pixel 03 adjacent to each other in the second direction B is parallel to the second direction B.

In other embodiments, the first sub-pixel 01, the second sub-pixel 02, and the third sub-pixel 03 may be in a shape of rhombus instead of square in the foregoing embodiments.

Optionally, in the above display substrates provided by the embodiments of the present disclosure, as shown in FIG. 5, the second sub-pixel 02 may also be in a shape of quadrangle, such as parallelogram. An included angle between a first diagonal line 022 of the quadrangle and the first direction A is substantially greater than 0° and less than 45°, and an included angle between a second diagonal line 023 of the quadrangle and the second direction B is substantially greater than 0° and less than 45°.

The first sub-pixel 01 and the third sub-pixel 03 both are in a shape of hexagon, and the hexagon is an axisymmetric pattern including two axes of symmetry, and one of the two axes of symmetry is parallel to the first direction A, and the other one is parallel to the second direction B. In addition, as shown in FIG. 5, a line connecting centers of one first sub-pixel 01 and one third sub-pixel 03 adjacent to each other in the first direction A is inclined with respect to the first direction A and a line connecting centers of one first sub-pixel 01 and one third sub-pixel 03 adjacent to each other in the second direction B is parallel to the second direction B.

Optionally, in the above display substrates provided by the embodiments of the present disclosure, as shown in FIG. 9, the second sub-pixel 02 may be in a shape of quadrangle, such as square. The first sub-pixel 01 and the third sub-pixel 03 are in a shape of rectangle, and an extending direction of a long side of the first sub-pixel 01 is perpendicular to an extending direction of a long side of the third sub-pixel 03. A line connecting centers of one first sub-pixel 01 and one third sub-pixel 03 adjacent to each other in the first direction A is parallel to the first direction A and a line connecting centers of one first sub-pixel 01 and one third sub-pixel 03 adjacent to each other in the second direction B is parallel to the second direction B.

Specifically, in the above-described pixel arrangements provided by the embodiments of the present disclosure, the shapes and directions of the first sub-pixel 01, the second sub-pixel 02, and the third sub-pixel 03 are not limited to the above three cases, and the first sub-pixel 01, the second sub-pixel 02, and the third sub-pixel 03 may also be in a shape of circle, ellipse or convex polygon, etc., and it is not limited herein.

The first sub-pixel 01, the second sub-pixel 02, and the third sub-pixel 03 may have the same or similar shapes, or may have different shapes, which is not limited herein.

It should be noted that, in the embodiments of the present disclosure, patterns of sub-pixels being consistent with each other refers to that the sub-pixels have the same or similar shapes. For example, two sub-pixels both are in a shape of triangle, the two sub-pixels are considered to have a consistent shape regardless of whether the areas thereof are equal. Conversely, the pattern of the sub-pixels being inconsistent refers to that the sub-pixels have different shapes, for example, one is in a shape of circle and another one is in a shape of rectangle.

Figure 13:
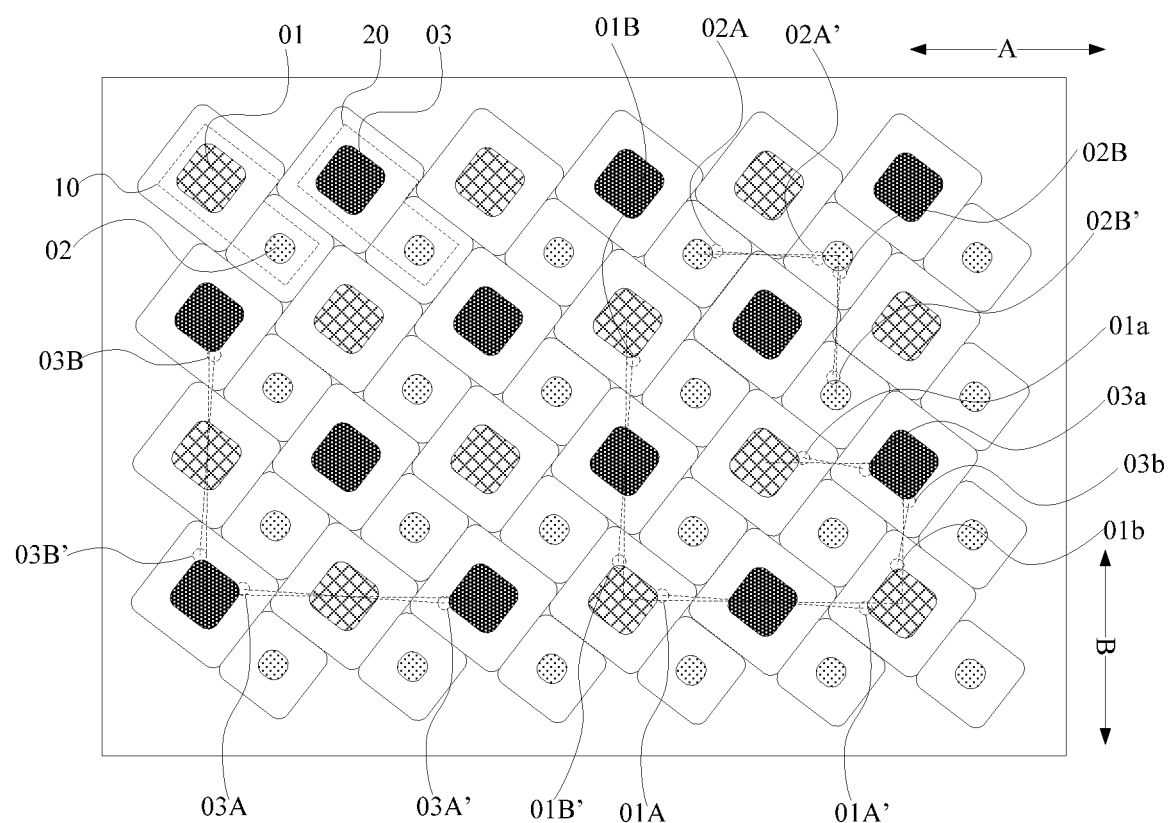
FIG. 13 is a schematic structural view of a pixel arrangement structure according to some embodiments of the present disclosure.
Figure 14:
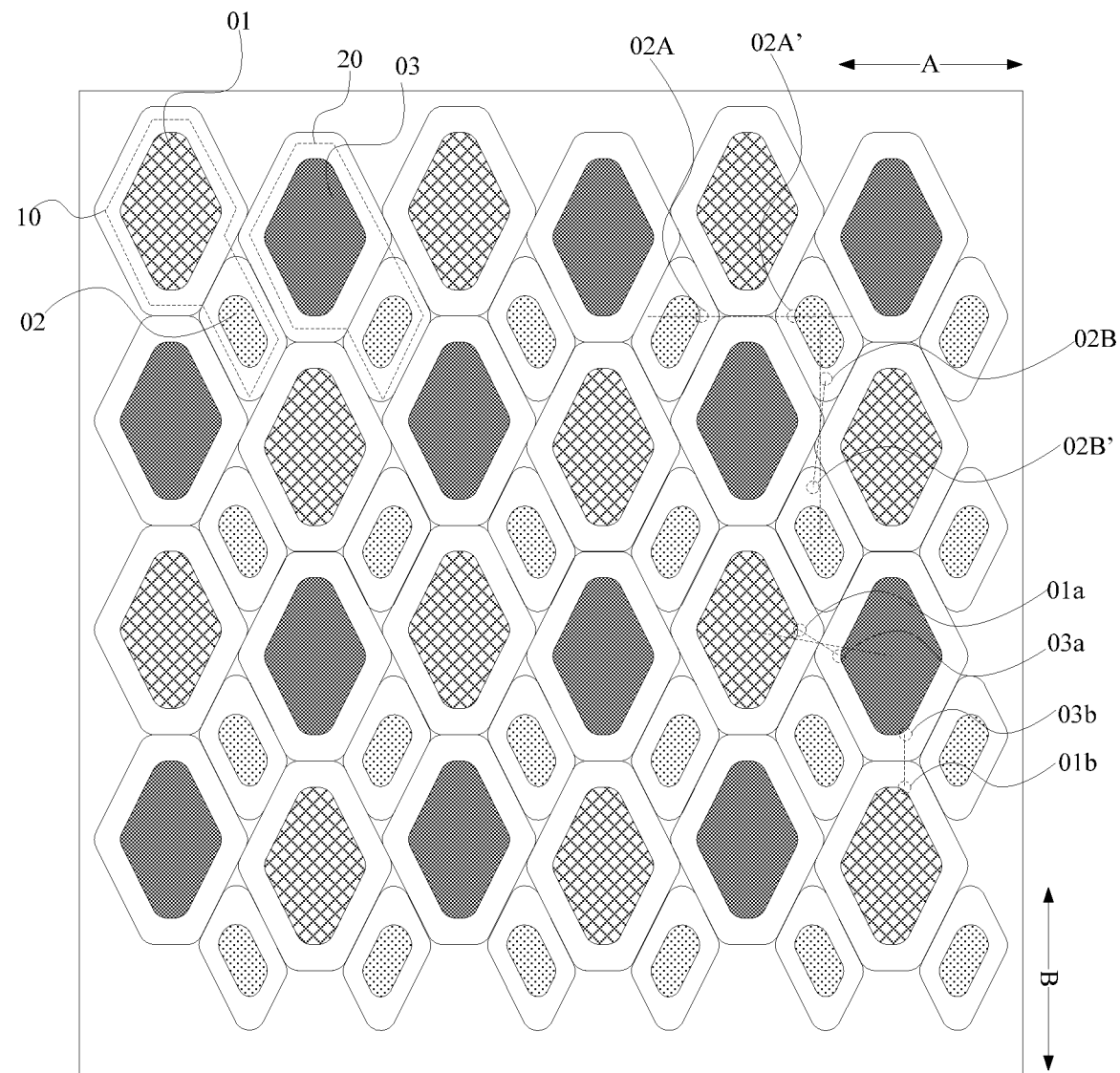
FIG. 14 is a schematic structural view of a pixel arrangement structure according to some embodiments of the present disclosure.
Figure 15:
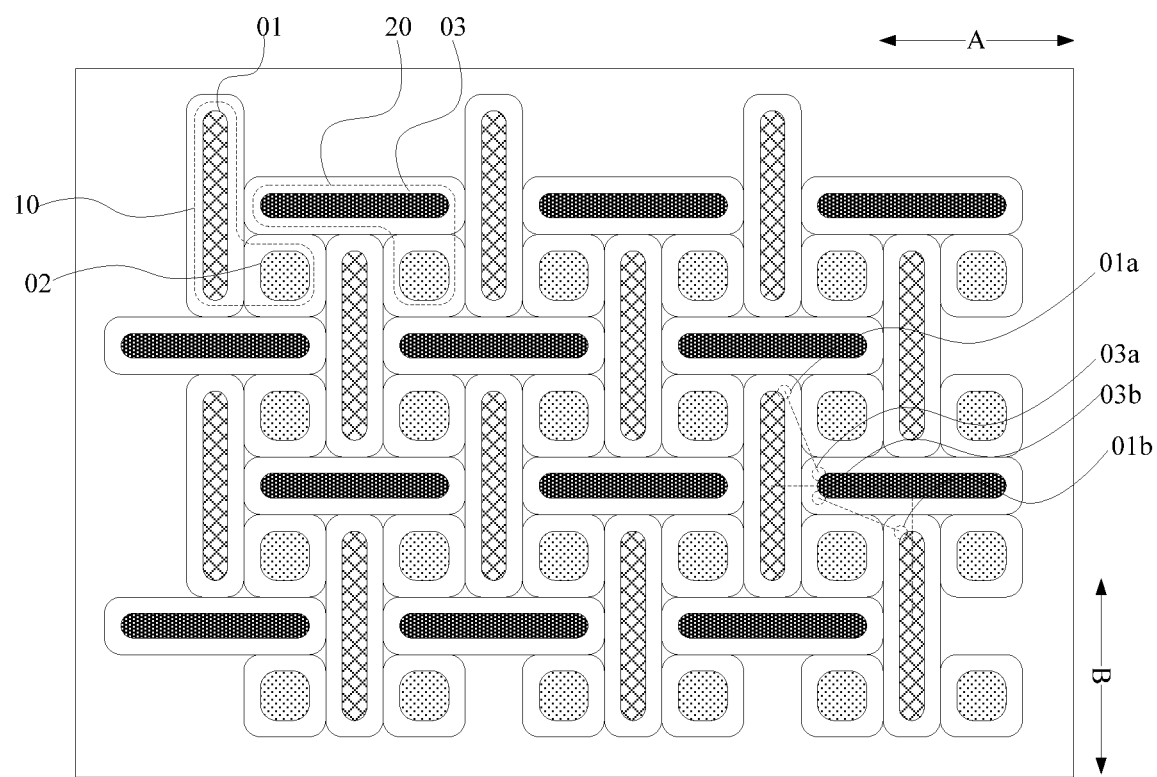
FIG. 15 is a schematic structural view of a pixel arrangement structure according to some embodiments of the present disclosure.

Optionally, in the above display substrates provided by the embodiments of the present disclosure, as shown in FIG. 13 to FIG. 15, the first sub-pixel 01, the second sub-pixel 02, and the third sub-pixel 03 may be in a shape of polygon having rounded corners. That is, on the basis of FIG. 1, FIG. 5 and FIG. 9, the shapes of the second sub-pixel 02, the first sub-pixel 01, and the third sub-pixel 03 may be rounded. The corresponding opening regions of the fine metal mask FMM for manufacturing the sub-pixels may have corresponding rounded corners to reduce the difficulty in manufacturing the fine metal mask FMM. The radius of the rounded corners is generally controlled to about 10 μm.

Optionally, the specific shapes, positional relationships, parallel and angular relationships of the first sub-pixel 01, the second sub-pixel 02, and the third sub-pixel 03 may be designed according to requirements. and in actual processes, there may be some deviations due to limitations of process conditions or other factors. Therefore, the sub-pixels may be arranged in the pixel arrangement manner provided by the embodiments of the present disclosure, as long as the shapes, the positions, and the relative positional relationships of the sub-pixels substantially satisfy the above conditions.

Optionally, in the display substrates provided by the embodiments of the present disclosure, the first sub-pixel 01 may be a red sub-pixel, and the third sub-pixel 03 may be a blue sub-pixel; or the first sub-pixel 01 may be a blue sub-pixel, and the third sub-pixel 03 may be a red sub-pixel, the second sub-pixel 02 is a green sub-pixel. In this way, adjacent green sub-pixel, red sub-pixel, and blue sub-pixel may constitute an illuminating pixel point. Specifically, it may be understood that one illuminating pixel point includes one green sub-pixel, and one quarter of each of two red sub-pixels and two blue sub-pixels adjacent the one green sub-pixel. That is, each red sub-pixel is shared by four illuminating pixel points, and each blue sub-pixel is electrically shared by four illuminating pixels, so that high-resolution display effect is achieved by using a low physical resolution display device through borrowing color principle.

Based on the same inventive concept, some embodiments of the present disclosure further provides a fine metal mask set for manufacturing the above display substrates provided by the embodiments of the present disclosure, as shown in FIG. 2 to FIG. 4, FIG. 6 to FIG. 8, FIG. 10 to FIG. 12, the fine metal mask set includes a first fine metal mask FMM1, a second fine metal mask FMM2, and a third fine metal mask FMM3. The first fine metal mask FMM1 has a plurality of first opening regions 011 having corresponding shapes and positions with the first sub-pixels 01, the second fine metal mask FMM2 has a plurality of second opening regions 021 having corresponding shapes and positions with the second sub-pixels 02, and the third fine metal mask FMM3 has a plurality of third opening regions 031 having corresponding shapes and positions with the third sub-pixels 03.

Optionally, in the above-mentioned fine metal masks provided by the embodiments of the present disclosure, as shown in FIG. 2 to FIG. 4 and FIG. 8, the opening regions may generally be in a shape of a polygon, and adjacent corners of two opening regions adjacent to each other in the first direction are staggered in the second direction, and/or adjacent corners of two opening regions adjacent to each other in the second direction are staggered in the first direction. Specifically, as shown in FIG. 2, in the first fine metal mask FMM1 for manufacturing the first sub-pixels 01, adjacent corners 011A and 011A of two first opening regions 011 adjacent to each other in the first direction A are staggered in the second direction B, and the adjacent corners 011B and 011B' of two first opening regions 011 adjacent to each other in the second direction B are also staggered in the first direction A. As shown in FIG. 3, in the third fine metal mask FMM3 for manufacturing the third sub-pixels 03, adjacent corners 031A and 031A' of two third opening regions 031 adjacent to each other in the first direction A are staggered in the second direction B, and adjacent corners 031B and 031B' of two third opening regions 031 adjacent to each other in the second direction B are also staggered in the first direction A. As shown in FIG. 4, in the second fine metal mask FMM2 for manufacturing the second sub-pixels 02, adjacent corners 021A and 021A' of two second opening regions 021 adjacent to each other in the first direction A are staggered in the second direction B, and adjacent corners 021B and 021B' of two second opening regions 021 adjacent to each other in the second direction B are also staggered in the first direction A. As shown in FIG. 8, in the second fine metal mask FMM2 for fabricating the second sub-pixels 02, adjacent corners 021B and 021B' of two second opening regions 021 adjacent to each other in the second direction B are staggered in the first direction A, and adjacent corners 021A and 021A' of two second opening region 021 adjacent to each other in the first direction A are aligned in the second direction B.

By adopting the fine metal masks as described above, it is possible to increase the aperture ratio of the fine metal masks FMM in a case where there is a set process pitch between the opening regions adjacent to each other, thereby improving the display resolution of the produced display substrate.

Based on the same inventive concept, some embodiments of the present disclosure further provide a display device including any of the above display substrates provided by the embodiments of the present disclosure. The display device may be any product or component having a display function, such as a mobile phone, a tablet computer, a television, a display, a notebook computer, a digital photo frame, a navigator, and the like. For the implementation of the display device, reference may be made to the embodiments of the above display substrates, and the repeated description is omitted.

The display substrate, the fine metal mask set and the display device are provided by the embodiments of the present disclosure, the display substrate includes a plurality of first pixels and a plurality of second pixels alternately arranged in a first direction and a second direction. The first pixel includes a first sub-pixel and a second sub-pixel, and the second pixel includes a third sub-pixel and a second sub-pixel. The second sub-pixels are evenly arranged in a matrix, and each second sub-pixel and two first sub-pixels and two third sub-pixels arranged therearound constitute a windmill-like structure. The first sub-pixel and the third sub-pixel are both in a polygonal shape, and alternately arranged in the first direction and the second direction. A line connecting adjacent vertexes of one first sub-pixel and one third sub-pixel adjacent to each other in the first direction intersects an extension line in the first direction and an extension line in the second direction, for example, adjacent corners of the one first sub-pixel and the one third sub-pixel adjacent to each other in the first direction are staggered in the second direction. This kind of sub-pixel arrangement is advantageous for improving the compactness of the sub-pixel arrangement. In the pixel arrangement of the windmill-like structure, compared with a pixel arrangement of the related art, the first sub-pixel, the second sub-pixel and the third sub-pixel may be closely arranged under the same process condition, a distance between adjacent sub-pixels may be reduced as much as possible, so that the sub-pixel aperture area is increased under the condition of the same resolution, and the driving current of the display device is reduced, thereby increasing the lifetime of the display device.

It will be apparent to those skilled in the art that various changes and modifications may be made in the present disclosure without departing from the spirit and scope of the disclosure. Thus, if such modifications and variations of the present disclosure are within the scope of the appended claims and their equivalents, the present invention is also intended to cover such modifications and variations.

What is claimed is:

1. A display substrate, wherein the display substrate comprises a plurality of sub-pixel groups, the plurality of sub-pixel groups are arranged in a first direction or a second direction, and at least one sub-pixel group comprises two first sub-pixels, four second sub-pixels and two third sub-pixels, wherein, in the at least one sub-pixel group, each of the four second sub-pixels comprises at least one pair of parallel sides, and multiple pairs of parallel sides of the four second sub-pixels are parallel to one another, the multiple pairs of parallel sides of the four second sub-pixels are respectively parallel to at least one side of each first sub-pixel, and the multiple pairs of parallel sides of the second sub-pixels are respectively parallel to at least one side of each third sub-pixel;

in the at least one sub-pixel group, one first sub-pixel and one third sub-pixel are located on a first side of the four second sub-pixels, and the other first sub-pixel and the other third sub-pixel are located on a second side of the four third sub-pixels, the second side is opposite to the first side, the first sub-pixel located on the first side of the four second sub-pixels is located in the same row as the third sub-pixel located on the second side of the four second sub-pixels, and the third sub-pixel located on the first side of the four second sub-pixels is located in the same row as the first sub-pixel located on the second side of the four second sub-pixels;

the plurality of sub-pixel groups are arranged in the first direction, and in two adjacent sub-pixel groups, the first sub-pixel located on the second side in a first sub-pixel group and the third sub-pixel located on the first side in a second sub-pixel group are adjacent to each other, the third sub-pixel located on the second side in the first sub-pixel group and the first sub-pixel located on the first side in the second sub-pixel group are adjacent to each other; and in one of the sub-pixel groups, a size of each first sub-pixel in the second direction is greater than a size of the first sub-pixel in the first direction, a size of each third sub-pixel in the second direction is greater than a size of the third sub-pixel in the first direction, and each of a size of the first sub-pixel and a size of the third sub-pixel in the second direction is greater than a size of each second sub-pixel in the second direction.

2. The display substrate of claim 1, wherein, in one of the sub-pixel groups, each of the four second sub-pixels comprises a first pair of parallel sides and a second pair of parallel sides;

the first pair of parallel sides are parallel to at least one side of each first sub-pixel, and the first pair of parallel sides are parallel to at least one side of each third sub-pixel; and the second pair of parallel sides are parallel to at least one side of each first sub-pixel, and the second pair of parallel sides are parallel to at least one side of each third sub-pixel.

3. The display substrate of claim 1, wherein, in one of the sub-pixel groups, the four second sub-pixels are arranged in a second direction, a first angle is formed between at least one side of each first sub-pixel and the second direction, the first angle is greater than 0° and less than or equal to 90°, a second angle is formed between at least one side of each third sub-pixel and the second direction, and the second angle is greater than 0° and less than or equal to 90°.

4. The display substrate of claim 1, wherein, in one of the sub-pixel groups:

a distance between two farthest ends of the first sub-pixels and the third sub-pixels located on the first side of the four second sub-pixels in the second direction does not exceed a distance between two farthest ends of the four second sub-pixels in the second direction; and/or a distance between two farthest ends of the first sub-pixels and the third sub-pixels located on the second side of the four second sub-pixels in the second direction does not exceed a distance between two farthest ends of the four second sub-pixels in the second direction.

5. The display substrate of claim 1, wherein, in one of the sub-pixel groups:

an orthographic projection of one first sub-pixel on a straight line, on which the second direction is located, overlaps at least partially orthographic projections of two second sub-pixels, that are adjacent to the one first sub-pixel, on the straight line; and/or an orthographic projection of one third sub-pixel on the straight line, on which the second direction is located, overlaps at least partially orthographic projections of two second sub-pixels, that are adjacent to the one third sub-pixel, on the straight line.

6. The display substrate of claim 1, wherein, in one of the sub-pixel groups:

there is a first gap between the first sub-pixel and the third sub-pixel located on the first side of the four second sub-pixels;

there is a second gap between the third sub-pixel and the first sub-pixel located on the second side of the four second sub-pixels;

there is a third gap between two adjacent ones of the four second sub-pixels;

an orthographic projection of the first gap on a straight line, on which the second direction is located, does not coincide with an orthographic projection of the second gap on the straight line; and an orthographic projection of each of the first gap and the second gap on the straight line does not coincide with an orthographic projection of the third gap on the straight line.

7. The display substrate of claim 1, wherein, in one of the sub-pixel groups, each first sub-pixel comprises a first side parallel to the first direction, and each third sub-pixel comprises a second side parallel to the first direction, and wherein:

the first side of the first sub-pixel and the second side of the third sub-pixel located in the same row as the first sub-pixel are not located on a same straight line; and/or a line connecting centers of the first sub-pixel and the third sub-pixel in the same row is inclined with respect to the first direction.

8. The display substrate of claim 1, wherein, in one of the sub-pixel groups, as for the first sub-pixel and the third sub-pixel that are respectively located on two sides of the four second sub-pixels and located in the same row, the first sub-pixel has a first vertex close to the third sub-pixel, the third sub-pixel has a second vertex close to the first sub-pixel, and a distance between the first vertex and the second vertex in the first direction is equal to the shortest distance between the first sub-pixel and the third sub-pixel, and a line connecting the first vertex and the second vertex is inclined with respect to the first direction.

9. The display substrate of claim 1, wherein, in one of the sub-pixel groups:

a size of each third sub-pixel in the second direction is greater than a size of each first sub-pixel in the second direction.

10. The display substrate of claim 1, wherein, in one of the sub-pixel groups, a distance between centers of the two first sub-pixels is greater than a distance between centers of the two third sub-pixels.

11. The display substrate of claim 1, wherein, in one of the sub-pixel groups, the four second sub-pixels have the same shape and the same area, and the four second sub-pixels are repeatedly arranged in the second direction.

12. The display substrate of claim 1, wherein:

each first sub-pixel comprises a plurality of vertex angles, and at least one of the plurality of vertex angles of the first sub-pixel is an obtuse angle; and/or each third sub-pixel comprises a plurality of vertex angles, and at least one of the plurality of vertex angles of the third sub-pixel is an obtuse angle.

13. The display substrate of claim 1, wherein, in one of the sub-pixel groups:

the shortest distance between the two first sub-pixels is not equal to the shortest distance between the two third sub-pixels; or the shortest distance between the two first sub-pixels is greater than the shortest distance between the two third sub-pixels.

14. The display substrate of claim 1, wherein, in one of the sub-pixel groups, a line connecting two closest vertices of the two first sub-pixels is inclined at a third angle with respect to the first direction, a line connecting two closest vertices of the two third sub-pixels is inclined at a fourth angle with respect to the first direction, and the third angle is not equal to the fourth angle.

15. The display substrate of claim 1, wherein, in one of the sub-pixel groups:
    each first sub-pixel comprises at least a pair of parallel sides, and the pair of parallel sides of the first sub-pixel are parallel to a pair of parallel sides of each second sub-pixel; and/or
    each third sub-pixel comprises at least a pair of parallel sides, and the pair of parallel sides of the third sub-pixel are parallel to a pair of parallel sides of each second sub-pixel.

16. The display substrate of claim 1, wherein, in one of the sub-pixel groups, the shortest distance between two adjacent second sub-pixels is equal to a distance between two closest vertices of the two adjacent second sub-pixels.

17. The display substrate of claim 1, wherein, for at least two adjacent sub-pixel groups in the first direction, a line connecting centers of the first sub-pixels in the same row is parallel to the first direction, a line connecting centers of the third sub-pixels in the same row is parallel to the first direction, a line connecting centers of the second sub-pixels in the same row is parallel to the first direction, and the line connecting centers of the first sub-pixels in the same row, the line connecting centers of the third sub-pixels in the same row, and the line connecting centers of the second sub-pixels in the same row do not coincide with one another.

18. The display substrate of claim 1, wherein, in one of the sub-pixel groups, the shortest distance between adjacent first sub-pixel and third sub-pixel is substantially equal to the shortest distance between adjacent first sub-pixel and second sub-pixel; and/or the shortest distance between adjacent first sub-pixel and third sub-pixel is substantially equal to the shortest distance between adjacent third sub-pixel and second sub-pixel; and
    wherein each first sub-pixel is a red sub-pixel, and each third sub-pixel is a blue sub-pixel.

19. The display substrate of claim 1, wherein:
    each of the four second sub-pixels in one of the sub-pixel groups has a quadrangular shape, and each of the four second sub-pixels has two pairs of parallel sides; or
    as for at least two adjacent sub-pixel groups in the first direction, long sides of the second sub-pixels located in the same row are parallel to one another, and short sides of the second sub-pixels located in the same row are parallel to one another; or
    each of the four second sub-pixels in one of the sub-pixel groups has a rectangular shape, and the four second sub-pixels are arranged in the second direction, a rectangle of each of the four second sub-pixels has two pairs of parallel sides, wherein one pair of parallel sides is parallel to the first direction, and the other pair of parallel sides is parallel to the second direction.

* * * * *